(12) United States Patent
Wang

(10) Patent No.: US 10,277,245 B2
(45) Date of Patent: Apr. 30, 2019

(54) DIGITAL TO ANALOG CONVERTER CIRCUIT, DISPLAY PANEL AND DISPLAY DEVICE

(71) Applicant: BOE TECHNOLOGY GROUP CO., LTD., Beijing (CN)

(72) Inventor: Tangxiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,732

(22) PCT Filed: Jul. 3, 2017

(86) PCT No.: PCT/CN2017/091426
§ 371 (c)(1),
(2) Date: Dec. 14, 2017

(87) PCT Pub. No.: WO2018/032891
PCT Pub. Date: Feb. 22, 2018

(65) Prior Publication Data
US 2018/0358978 A1 Dec. 13, 2018

(30) Foreign Application Priority Data
Aug. 15, 2016 (CN) .......................... 2016 1 0669446

(51) Int. Cl.
*H03M 1/76* (2006.01)
*G09G 3/3208* (2016.01)
(52) U.S. Cl.
CPC ............ *H03M 1/76* (2013.01); *G09G 3/3208* (2013.01)

(58) Field of Classification Search
CPC ........ H03M 1/76; H03M 1/00; H03M 1/0646; H03M 1/785; H03M 1/12; H03M 1/66; H03M 1/747; G09G 3/3208
USPC ......................................... 341/148, 144, 154
See application file for complete search history.

(56) References Cited

U.S. PATENT DOCUMENTS

| 5,703,588 | A | * | 12/1997 | Rivoir ................. H03M 1/0604 341/118 |
| 6,268,817 | B1 | * | 7/2001 | Min ...................... H03M 1/682 341/145 |
| 6,317,069 | B1 | * | 11/2001 | Male ...................... H03M 1/785 341/145 |
| 6,486,818 | B1 | * | 11/2002 | Nicholson ............. H03M 1/682 341/145 |

(Continued)

FOREIGN PATENT DOCUMENTS

| CN | 101316103 | 12/2008 |
| CN | 103354451 | 10/2013 |

(Continued)

OTHER PUBLICATIONS

BOE Technology Group Co., Ltd., "Search Report" for Chinese Application No. 201610669446.2, dated Feb. 28, 2017.

(Continued)

*Primary Examiner* — Jean B Jeanglaude
(74) *Attorney, Agent, or Firm* — Womble Bond Dickinson (US) LLP

(57) ABSTRACT

A digital to analog converter circuit, a display panel and a display device are provided. The digital to analog converter circuit includes a voltage dividing unit, a first segmenting unit, a second segmenting unit and a third segmenting unit.

20 Claims, 11 Drawing Sheets

(56) References Cited

U.S. PATENT DOCUMENTS

| | | | | |
|---|---|---|---|---|
| 6,914,547 | B1* | 7/2005 | Swaroop | H03M 1/682 341/144 |
| 6,954,165 | B2* | 10/2005 | Mallinson | H03M 1/0604 341/144 |
| 7,015,847 | B1* | 3/2006 | McLachlan | H03M 1/1205 341/144 |
| 7,102,424 | B2* | 9/2006 | Vorenkamp | H03M 1/0602 327/104 |
| 7,330,066 | B2* | 2/2008 | Huang | G09G 3/2011 327/540 |
| 7,425,941 | B2* | 9/2008 | Sung | G09G 3/3688 341/144 |
| 7,639,166 | B2* | 12/2009 | Iijima | H03M 1/682 341/144 |
| 7,710,302 | B2* | 5/2010 | Iadanza | H03M 1/06 341/144 |
| 7,956,786 | B2* | 6/2011 | Cosgrave | H03M 1/682 341/144 |
| 7,982,581 | B2* | 7/2011 | Jha | H03H 7/24 338/118 |
| 8,350,739 | B2* | 1/2013 | Prater | H03M 1/1061 327/157 |
| 8,907,832 | B2* | 12/2014 | Price | H03M 1/0602 341/144 |
| 9,276,598 | B1* | 3/2016 | Li | H03M 1/1057 |
| 2008/0297390 | A1 | 12/2008 | Ko et al. | |
| 2014/0347202 | A1 | 11/2014 | Price et al. | |

FOREIGN PATENT DOCUMENTS

| | | |
|---|---|---|
| CN | 105007677 | 10/2015 |
| CN | 105609038 | 5/2016 |
| CN | 105656490 | 6/2016 |
| CN | 106330194 | 1/2017 |

OTHER PUBLICATIONS

BOE Technology Group Co., Ltd., "International Search Report" for Chinese PCT Application No. PCT/CN2017/091426, dated Sep. 27, 2017.

BOE Technology Group Co., Ltd., "First Office Action" for Chinese Application No. 201610669446.2, dated May 10, 2017.

BOE Technology Group Co., Ltd., "Second Office Action" for Chinese Application No. 201610669446.2, dated Jul. 18, 2017.

* cited by examiner

US 10,277,245 B2

DIGITAL TO ANALOG CONVERTER CIRCUIT, DISPLAY PANEL AND DISPLAY DEVICE

RELATED APPLICATION

The present application is the U.S. national phase entry of PCT/CN2017/091426, with an international filing date of Jul. 3, 2017, which claims the priority of the Chinese patent application No. 201610669446.2 filed on Aug. 15, 2016, the entire disclosure of which is incorporated herein by reference.

FIELD

This disclosure relates to the field of display technology, particularly to a digital to analog converter circuit, a display panel and a display device.

BACKGROUND

At present, generally, digital to analog converters (DACs) suitable for a display are mainly divided into a current-steering type and a resistor string voltage divider type. Although the current-steering type DAC has characteristics of high speed and high precision, when it is used for driving a signal to transmit towards a transmission line, in order to inhibit reflection of the transmitted signal, an output impedance of the current-steering type DAC must be equal to a characteristic impedance of the transmission line, resulting in a relatively large power consumption of the current-steering type DAC. On the other hand, although the resistor string voltage divider type DAC has advantages of simple structure, low noise and good linearity etc., the precision of the resistor string voltage divider type DAC is mainly determined by the match of the resistor string.

With the development of high definition display technology, the requirement on the performance of the DAC in a display becomes higher and higher, which is required above 10 bits generally. At present, the resistor string voltage divider type 10 bit DAC has a complex structure, which brings large amount of wiring issues. Moreover, the 10 bit DAC generally occupies an area up to 60%-70% in a chip, which occupies a relatively large area of the chip.

In order to solve the above problems, some 10 bit DACs using a two-stage segmented structure are put forth. Such a structure divides the 10 bit DAC into two stages. Generally, a first stage uses a global resistor string structure. Two adjacent reference voltages VL and VH are selected from the global resistor string by a voltage selector, and then, a second stage divides the two adjacent voltages obtained by the first stage accurately, so as to obtain a final analog voltage. In such a solution, although the number of switches is reduced to some extent, the number of reference voltage points is not reduced, hence, it may still render the structure thereof complex and bring large amount of wiring issues. Moreover, the occupied area is also relatively large, which is not benefit for improving competitiveness of the product.

SUMMARY

An embodiment of this disclosure provides a digital to analog converter circuit, comprising: a voltage dividing unit, a first segmenting unit, a second segmenting unit and a third segmenting unit.

The voltage dividing unit has $2^i+1$ voltage dividing signal terminals, which are defined as 1st to $2^i+1$th voltage dividing signal terminals according to voltage from low to high successively, wherein, i is an even number greater than or equal to 8.

First terminals of the first segmenting unit are connected in correspondence with the 1th to the $2^i+1$th voltage dividing signal terminals respectively, a second terminal of the first segmenting unit is connected with a first digital signal terminal, and output terminals of the first segmenting unit are connected with a first node, a second node, a third node, a fourth node and a fifth node respectively. The first segmenting unit is configured to, under control of a kth digital signal in a set of i−2 bit binary sequences received at the second terminal, provide a signal of a 4 k−3th voltage dividing signal terminal to the first node, provide a signal of a 4 k−2th voltage dividing signal terminal to the second node, provide a signal of a 4 k−1th voltage dividing signal terminal to the third node, provide a signal of a 4 kth voltage dividing signal terminal to the fourth node, and provide a signal of a 4 k+1th voltage dividing signal terminal to the fifth node, wherein k is an integer greater than or equal to 1 and less than or equal to $2^{i-2}$.

A first terminal of the second segmenting unit is connected with the first node, a second terminal of the second segmenting unit is connected with the second node, a third terminal of the second segmenting unit is connected with the third node, a fourth terminal of the second segmenting unit is connected with the fourth node, a fifth terminal of the second segmenting unit is connected with the fifth node, a sixth terminal of the second segmenting unit is connected with a second digital signal terminal, and output terminals of the second segmenting unit are connected with a sixth node and a seventh node respectively. The second segmenting unit is configured to, under control of an mth digital signal in a set of 2 bit binary sequences received at the sixth terminal of the second segmenting unit, provide a signal of an mth terminal of the second segmenting unit to the sixth node, and provide a signal of an m+1th terminal of the second segmenting unit to the seventh node, wherein m is an integer greater than or equal to 1 and less than or equal to 4.

A first terminal of the third segmenting unit is connected with the sixth node, a second terminal of the third segmenting unit is connected with the seventh node, and an output terminal of the third segmenting unit is connected with an analog signal output terminal of the digital to analog converter circuit. The third segmenting unit is configured to provide four analog signals with different voltages corresponding to a voltage of the first terminal of the third segmenting unit to the analog signal output terminal.

In some embodiments, in the digital to analog converter circuit provided by an embodiment of this disclosure, the first segmenting unit comprises a first switch control sub-circuit, a second switch control sub-circuit, a third switch control sub-circuit, a fourth switch control sub-circuit and a fifth switch control sub-circuit.

First terminals of the first switch control sub-circuit are connected in correspondence with the 4 k−3th voltage dividing signal terminal respectively, a second terminal of the first switch control sub-circuit is connected with the first digital signal terminal, and an output terminal of the first switch control sub-circuit is connected with the first node. The first switch control sub-circuit is configured to, under control of a kth digital signal received at the second terminal of the first switch control sub-circuit, provide a signal of the 4 k−3th voltage dividing signal terminal to the first node.

First terminals of the second switch control sub-circuit are connected in correspondence with the 4 k−2th voltage dividing signal terminal respectively, a second terminal of the second switch control sub-circuit is connected with the first digital signal terminal, and an output terminal of the second switch control sub-circuit is connected with the second node. The second switch control sub-circuit is configured to, under control of a kth digital signal received at the second terminal of the second switch control sub-circuit, provide the signal of the 4 k−2th voltage dividing signal terminal to the second node.

First terminals of the third switch control sub-circuit are connected in correspondence with the 4 k−1th voltage dividing signal terminal respectively, a second terminal of the third switch control sub-circuit is connected with the first digital signal terminal, and an output terminal of the third switch control sub-circuit is connected with the third node. The third switch control sub-circuit is configured to, under control of a kth digital signal received at the second terminal of the third switch control sub-circuit, provide the signal of the 4 k−1th voltage dividing signal terminal to the third node.

First terminals of the fourth switch control sub-circuit are connected in correspondence with the 4 kth voltage dividing signal terminal respectively, a second terminal of the fourth switch control sub-circuit is connected with the first digital signal terminal, and an output terminal of the fourth switch control sub-circuit is connected with the fourth node. The fourth switch control sub-circuit is configured to, under control of a kth digital signal received at the second terminal of the fourth switch control sub-circuit, provide the signal of the 4 kth voltage dividing signal terminal to the fourth node.

First terminals of the fifth switch control sub-circuit are connected in correspondence with the 4 k+1th voltage dividing signal terminal respectively, a second terminal of the fifth switch control sub-circuit is connected with the first digital signal terminal, and an output terminal of the fifth switch control sub-circuit is connected with the fifth node. The fifth switch control sub-circuit is configured to, under control of a kth digital signal received at the second terminal of the fifth switch control sub-circuit, provide the signal of the 4 k+1th voltage dividing signal terminal to the fifth node.

In some embodiments, in the digital to analog converter circuit provided by an embodiment of this disclosure, the first switch control sub-circuit comprises a first switch network of an i−2 bit binary switch tree type.

First input terminals of the first switch network are connected in correspondence with the 4 k−3th voltage dividing signal terminal, a second input terminal of the first switch network is connected with the first digital signal terminal, and an output terminal of the first switch network is connected with the first node.

In some embodiments, in the digital to analog converter circuit provided by an embodiment of this disclosure, the second switch control sub-circuit comprises a second switch network of an i−2 bit binary switch tree type.

First input terminals of the second switch network are connected in correspondence with the 4 k−2th voltage dividing signal terminal, a second input terminal of the second switch network is connected with the first digital signal terminal, and an output terminal of the second switch network is connected with the second node.

In some embodiments, in the digital to analog converter circuit provided by an embodiment of this disclosure, the third switch control sub-circuit comprises a third switch network of an i−2 bit binary switch tree type.

First input terminals of the third switch network are connected in correspondence with the 4 k−1th voltage dividing signal terminal, a second input terminal of the third switch network is connected with the first digital signal terminal, and an output terminal of the third switch network is connected with the third node.

In some embodiments, in the digital to analog converter circuit provided by an embodiment of this disclosure, the fourth switch control sub-circuit comprises a fourth switch network of an i−2 bit binary switch tree type.

First input terminals of the fourth switch network are connected in correspondence with the 4 k voltage dividing signal terminal, a second input terminal of the fourth switch network is connected with the first digital signal terminal, and an output terminal of the fourth switch network is connected with the fourth node.

In some embodiments, in the digital to analog converter circuit provided by an embodiment of this disclosure, the fifth switch control sub-circuit comprises a fifth switch network of an i−2 bit binary switch tree type.

First input terminals of the fifth switch network are connected in correspondence with the 4 k+1th voltage dividing signal terminal, a second input terminal of the fifth switch network is connected with the first digital signal terminal, and an output terminal of the fifth switch network is connected with the fifth node.

In some embodiments, in the digital to analog converter circuit provided by an embodiment of this disclosure, the second segmenting unit comprises a sixth switch control sub-circuit and a seventh switch control sub-circuit.

A first terminal of the sixth switch control sub-circuit is connected with the first node, a second terminal of the sixth switch control sub-circuit is connected with the second node, a third terminal of the sixth switch control sub-circuit is connected with the third node, a fourth terminal of the sixth switch control sub-circuit is connected with the fourth node, a fifth terminal of the sixth switch control sub-circuit is connected with the second digital signal terminal, and an output terminal of the sixth switch control sub-circuit is connected with the sixth node. The six switch control sub-circuit is configured to, under control of an mth digital signal received at the fifth terminal of the sixth switch control sub-circuit, provide a signal of the mth terminal of the sixth switch control sub-circuit to the sixth node.

A first terminal of the seventh switch control sub-circuit is connected with the second node, a second terminal of the seventh switch control sub-circuit is connected with the third node, a third terminal of the seventh switch control sub-circuit is connected with the fourth node, a fourth terminal of the seventh switch control sub-circuit is connected with the fifth node, a fifth terminal of the seventh switch control sub-circuit is connected with the second digital signal terminal, and an output terminal of the seventh switch control sub-circuit is connected with the seventh node. The seventh switch control sub-circuit is configured to, under control of an mth digital signal received at the fifth terminal of the seventh switch control sub-circuit, provide a signal of the mth terminal of the seventh switch control sub-circuit to the seventh node.

In some embodiments, in the digital to analog converter circuit provided by an embodiment of this disclosure, the sixth switch control sub-circuit comprises a sixth switch network of a 2 bit binary switch tree type.

First input terminals of the sixth switch network are connected in correspondence with the first node, the second node, the third node and the fourth node, a second input terminal of the sixth switch network is connected with the second digital signal terminal, and an output terminal of the sixth switch network is connected with the sixth node.

In some embodiments, in the digital to analog converter circuit provided by an embodiment of this disclosure, the seventh switch control sub-circuit comprises a seventh switch network of a 2 bit binary switch tree type.

First input terminals of the seventh switch network are connected in correspondence with the second node, the third node, the fourth node and the fifth node, a second input terminal of the seventh switch network is connected with the second digital signal terminal, and an output terminal of the seventh switch network is connected with the seventh node.

In some embodiments, in the digital to analog converter circuit provided by an embodiment of this disclosure, the third segmenting unit comprises an eighth switch control sub-circuit, a ninth switch control sub-circuit and an amplifier.

A first terminal and a third terminal of the eighth switch control sub-circuit are connected with the sixth node respectively, a second terminal and a fourth terminal of the eighth switch control sub-circuit are connected with the seventh node respectively, a fifth terminal of the eighth switch control sub-circuit is connected with a third digital signal terminal, and an output terminal of the eighth switch control sub-circuit is connected with a first non-inverting input terminal of the amplifier. The eighth switch control sub-circuit is configured to, under control of an nth digital signal in a set of 2 bit binary sequences received at the fifth terminal of the eighth switch control sub-circuit, provide a signal of an nth terminal of the eighth switch control sub-circuit to the first non-inverting input terminal, wherein n is an integer greater than or equal to 1 and less than or equal to 4.

A first terminal and a second terminal of the ninth switch control sub-circuit are connected with the sixth node respectively, a third terminal and a fourth terminal of the ninth switch control sub-circuit are connected with the seventh node respectively, a fifth terminal of the ninth switch control sub-circuit is connected with the third digital signal terminal, and an output terminal of the ninth switch control sub-circuit is connected with a second non-inverting input terminal of the amplifier. The ninth switch control sub-circuit is configured to, under control of an nth digital signal in a set of 2 bit binary sequences received at the fifth terminal of the ninth switch control sub-circuit, provide a signal of an nth terminal of the ninth switch control sub-circuit to the second non-inverting input terminal.

A third non-inverting input terminal of the amplifier is connected with the sixth node, and an inverting input terminal of the amplifier is connected with an output terminal of the amplifier and the analog signal output terminal respectively. The amplifier is configured to add a voltage of a signal of the first non-inverting input terminal, a voltage of a signal of the second non-inverting input terminal and a voltage of a signal of the third non-inverting input terminal according to a preset sum rule, so as to output four analog signals with different voltages corresponding to the signal of the third non-inverting input terminal.

In some embodiments, in the digital to analog converter circuit provided by an embodiment of this disclosure, the eighth switch control sub-circuit comprises an eighth switch network of a 2 bit binary switch tree type.

A first input terminal and a third input terminal of the eighth switch network are connected in correspondence with the sixth node respectively, a second input terminal and a fourth input terminal of the eighth switch network are connected in correspondence with the seventh node respectively, a fifth input terminal of the eighth switch network is connected with the third digital signal terminal, and an output terminal of the eighth switch network is connected with the first non-inverting input terminal.

In some embodiments, in the digital to analog converter circuit provided by an embodiment of this disclosure, the ninth switch control sub-circuit comprises a ninth switch network of a 2 bit binary switch tree type.

A first input terminal and a second input terminal of the ninth switch network are connected in correspondence with the sixth node respectively, a third input terminal and a fourth input terminal of the ninth switch network are connected in correspondence with the seventh node respectively, a fifth input terminal of the ninth switch network is connected with the third digital signal terminal, and an output terminal of the ninth switch network is connected with the second non-inverting input terminal.

In some embodiments, in the digital to analog converter circuit provided by an embodiment of this disclosure, the amplifier is a rail to rail amplifier with three inputs.

In some embodiments, in the digital to analog converter circuit provided by an embodiment of this disclosure, a width to length ratio of a channel of a thin film transistor of the first non-inverting input terminal: a width to length ratio of a channel of a thin film transistor of the second non-inverting input terminal: a width to length ratio of a channel of a thin film transistor of the third non-inverting input terminal is 1:2:1.

In some embodiments, in the digital to analog converter circuit provided by an embodiment of this disclosure, the preset sum rule is ½Ve1+½Ve2+¼Ve3, wherein Ve1 is a voltage of the first non-inverting input terminal, Ve2 is a voltage of the second non-inverting input terminal, and Ve3 is a voltage of the third non-inverting input terminal.

In some embodiments, in the digital to analog converter circuit provided by an embodiment of this disclosure, the voltage dividing unit comprises a resistor string with $2^i$ resistors connected in series, a reference voltage terminal and a ground terminal.

The resistor string comprises $2^i+1$ series nodes, which are defined as 1st to $2^i+1$th series nodes according to voltage from low to high successively. The 1st series node is connected with the ground terminal, the $2^i+1$th series node is connected with the reference voltage terminal, and the 1st to the $2^i+1$th series nodes are connected in correspondence with the 1st to the $2^i+1$th voltage dividing signal terminals.

In some embodiments, in the digital to analog converter circuit provided by an embodiment of this disclosure, a switch in the switch network is a CMOS transmission gate structure.

Correspondingly, an embodiment of this disclosure further provides a display panel, comprising any digital to analog converter circuit provided by an embodiment of this disclosure.

Correspondingly, an embodiment of this disclosure further provides a display device, comprising the above display panel provided by an embodiment of this disclosure.

DETAILED DESCRIPTION

In order to enable the objects, the technical solutions and the advantages of this disclosure to more explicit, next, specific implementations of a digital to analog converter circuit, a display panel and a display device provided by embodiments of this disclosure will be explained in detail in conjunction with the drawings.

Figure 1:
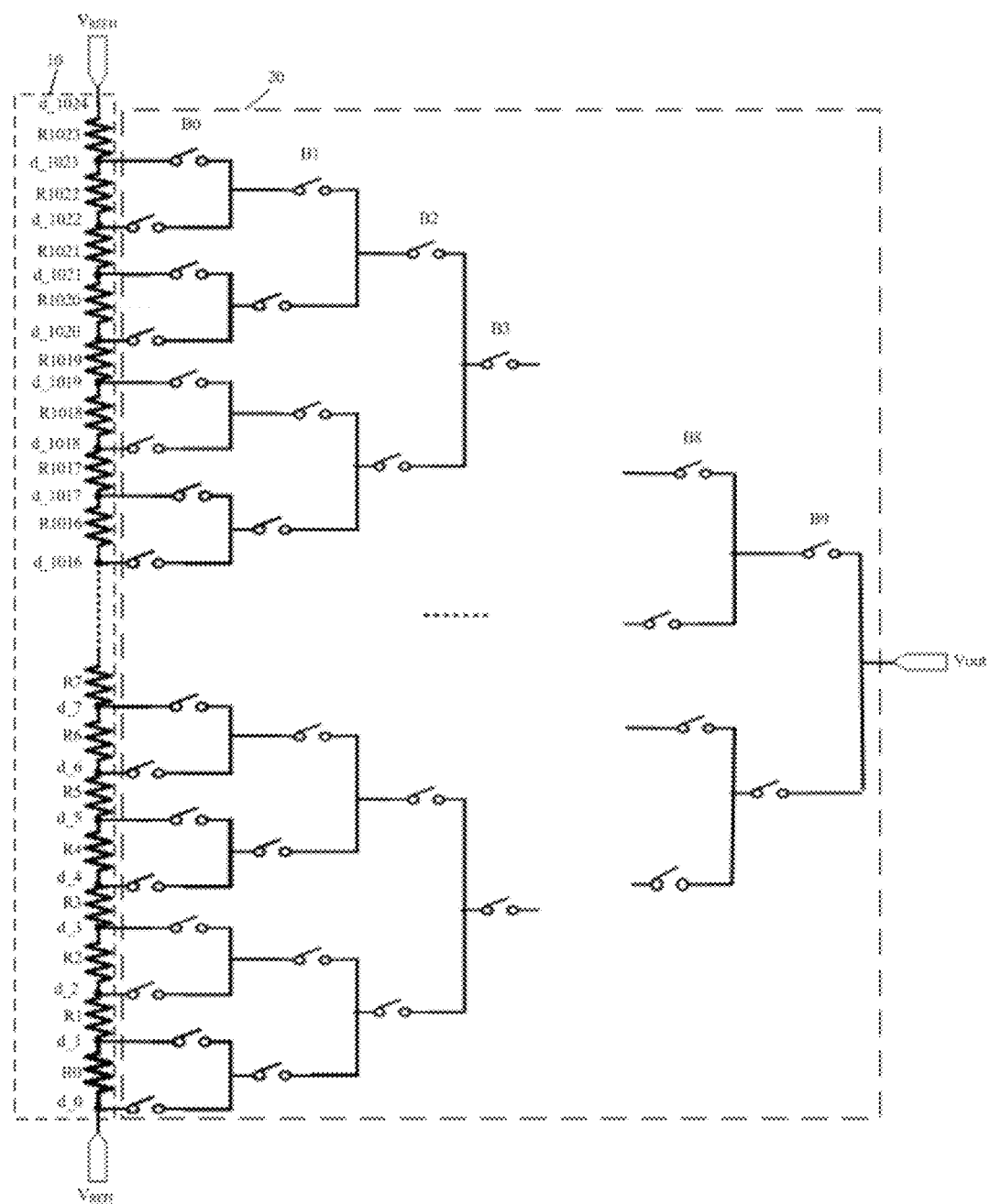
FIG. 1 is a schematic diagram of a specific structure of a conventional resistor string voltage divider type 10 bit DAC.

A conventional resistor string voltage divider type 10 bit DAC, as shown in FIG. 1, generally comprises: a resistor string 10 and a 10 bit binary selection switch network 20. The resistor string 10 comprises 1024 resistors Rx (x=0, 1, 2 . . . 1023) of same resistance value connected in series. The resistor string 10 comprises 1025 series nodes, potentials of which are defined as d_0~d_1024 from low to high successively, the series node $d_{13}$ 0 is connected with a low reference voltage terminal $V_{REFL}$, and the series node d_1024 is connected with a high reference voltage terminal $V_{REFH}$. The 10 bit binary selection switch network 20 comprises 2046 switches. The series nodes d_0~d_1023 in the resistor string 10 are connected in correspondence with signal input terminals in the 10 bit binary selection switch network 20 respectively, and digital signals B0~B9 control the 10 bit binary selection switch network 20 to select corresponding reference voltages from the resistor string 10, so as to realize conversion from digital signals to analog signals. Since the number of switches required in the above 10 bit DAC is 2046, the required reference voltage points is 1024, rendering the structure thereof complex and bringing large amount of wiring issues. Moreover, the 10 bit DAC generally occupies an area up to 60%-70% in a chip, which occupies a relatively large area of the chip.

Figure 2:
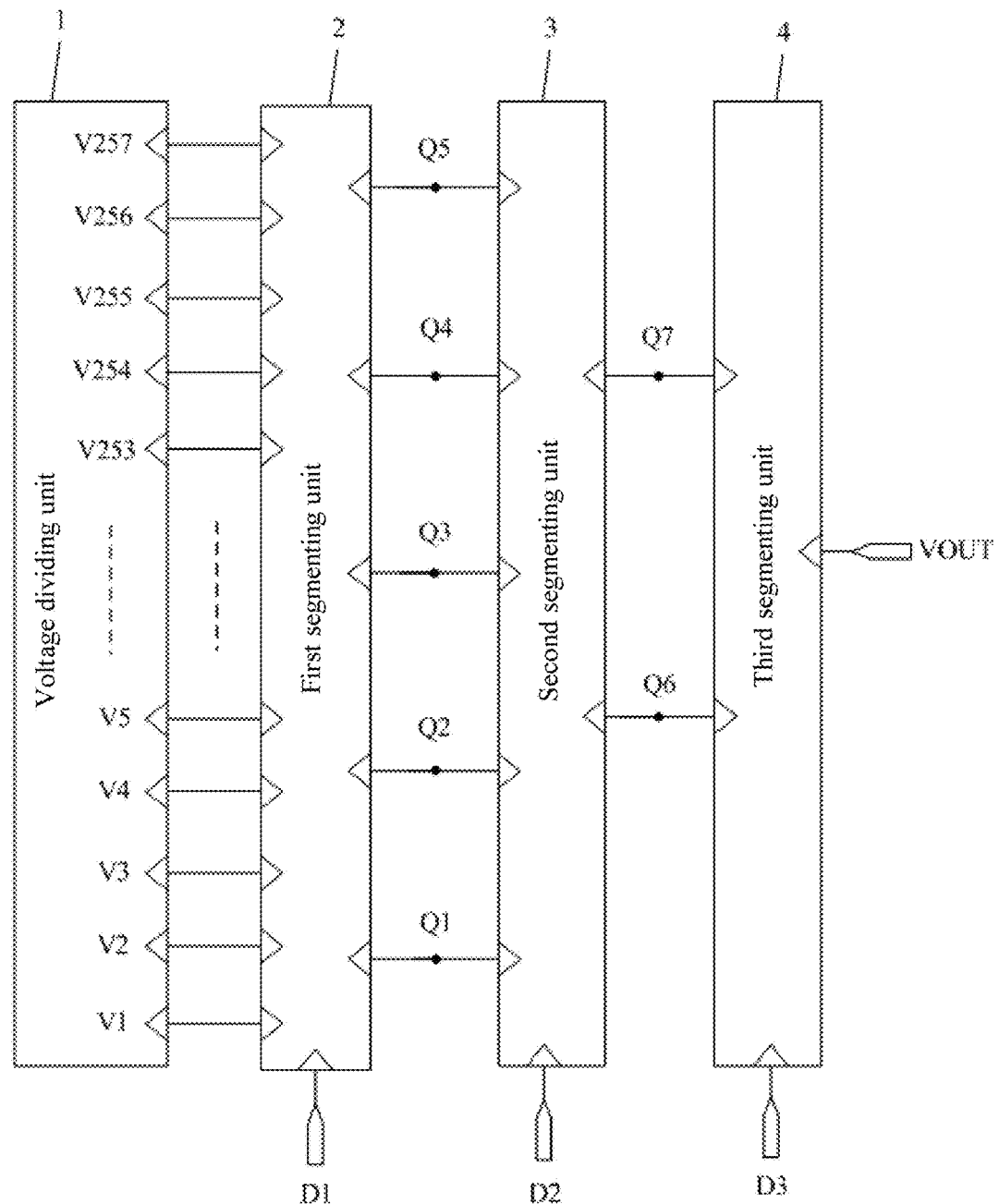
FIG. 2 is a structural schematic diagram of a digital to analog converter circuit provided by an embodiment of this disclosure.

A digital to analog converter circuit provided by an embodiment of this disclosure, as shown in FIG. 2, comprises: a voltage dividing unit 1, a first segmenting unit 2, a second segmenting unit 3 and a third segmenting unit 4.

The voltage dividing unit 1 has $2^i+1$ voltage dividing signal terminals, which are defined as 1st to $2^i+1$th voltage dividing signal terminals according to voltage from low to high successively, wherein, i is an even number greater than or equal to 8 (in FIG. 2, for example, i=8).

First terminals of the first segmenting unit 2 are connected in correspondence with the 1st to $2^i+1$th voltage dividing signal terminals V1~V$2^i$+1 respectively, a second terminal of the first segmenting unit 2 is connected with a first digital signal terminal D1, and output terminals of the first segmenting unit 2 are connected with a first node Q1, a second node Q2, a third node Q3, a fourth node Q4 and a fifth node Q5 respectively. The first segmenting unit 2 is configured to, under control of a kth digital signal in a set of i-2 bit binary sequences received at the second terminal, provide a signal of the 4 k-3th voltage dividing signal terminal to the first node Q1, provide a signal of the 4 k-2th voltage dividing signal terminal to the second node Q2, provide a signal of the 4 k-1th voltage dividing signal terminal to the third node Q3, provide a signal of the 4 kth voltage dividing signal terminal to the fourth node Q4, provide a signal of the 4 k+1th voltage dividing signal terminal to the fifth node Q5, wherein k is an integer greater than or equal to 1 and less than or equal to $2^{i-2}$.

A first terminal of the second segmenting unit 3 is connected with the first node Q1, a second terminal of the second segmenting unit 3 is connected with the second node Q2, a third terminal of the second segmenting unit 3 is connected with the third node Q3, a fourth terminal of the second segmenting unit 3 is connected with the fourth node Q4, a fifth terminal of the second segmenting unit 3 is connected with the fifth node Q5, a sixth terminal of the second segmenting unit 3 is connected with a second digital signal terminal D2, and output terminals of the second segmenting unit 3 are connected with a sixth node Q6 and a seventh node Q7 respectively. The second segmenting unit 3 is configured to, under control of the mth digital signal in a set of 2 bit binary sequences received by the sixth terminal of the second segmenting unit 3, provide a signal of the mth terminal of the second segmenting unit 3 to the sixth node Q6, and provide a signal of the m+1th terminal of the second segmenting unit 3 to the seventh node Q7, wherein m is an integer greater than or equal to 1 and less than or equal to 4.

A first terminal of the third segmenting unit 4 is connected with the sixth node Q6, a second terminal of the third segmenting unit 4 is connected with the seventh node Q7, and an output of the third segmenting unit 4 is connected with an analog signal output terminal VOUT of the digital to analog converter circuit. The third segmenting unit 4 is configured to provide four analog signals with different voltages corresponding to the voltage of the first terminal of the third segmenting unit 4 to the analog signal output terminal VOUT.

The digital to analog converter circuit provided by an embodiment of this disclosure comprises: a voltage dividing unit, a first segmenting unit, a second segmenting unit and a third segmenting unit. The voltage dividing unit is configured to provide $2^i+1$ voltage dividing signal terminals. The first segmenting unit is configured to, under control of the kth digital signal in a set of i-2 bit binary sequences received at the second terminal thereof, provide the signal of the 4 k-3th voltage dividing signal terminal to the first node, provide the signal of the 4 k-2th voltage dividing signal terminal to the second node, provide the signal of the 4 k-1th voltage dividing signal terminal to the third node, provide the signal of the 4 kth voltage dividing signal terminal to the fourth node, and provide the signal of the 4 k+1th voltage dividing signal terminal to the fifth node, wherein k is an integer greater than or equal to 1 and less than or equal to $2^{i-2}$. The second segmenting unit is configured to, under control of the mth digital signal in a set of 2 bit binary sequences received at the sixth terminal thereof, provide the signal of the mth terminal thereof to the sixth node, and provide the signal of the m+1th terminal thereof to the seventh node, wherein m is an integer greater than or equal to 1 and less than or equal to 4. The third segmenting unit is configured to provide four analog signals with different voltages corresponding to the voltage of the first terminal of the third segmenting unit to the analog signal output terminal. Therefore, the digital to analog converter circuit provided by the embodiment of this disclosure uses the segmentation mode. By means of mutual cooperation of the above four units, only $2^i+1$ voltage dividing signal terminals are required to output $2^{i-2}$ analog signals of different voltages. Compared to the prior art in which $2^{i+2}$ voltage dividing signal terminals are required, the digital to analog converter circuit provided by the embodiment of this disclosure can reduce the number of the voltage dividing signal terminals, simplify the structure, reduce the wiring difficulty and reduce the production cost.

Generally, a 2 bit binary sequence includes four different digital signals of 00, 01, 10, 11, wherein the first digital signal is 00, the second digital signal is 01, the third digital signal is 10, and the fourth digital signal is 11. When i=8, a 6 bit binary sequence includes 64 different digital signals of 000000, 000001, 000010 . . . 111110, 111111, wherein the first digital signal is 000000, the second digital signal is 000001, the third digital signal is 000010, and so on. When i=10, an 8 bit binary sequence includes 256 different digital signals of 00000000, 00000001, 00000010 . . . 11111110, 11111111, wherein the first digital signal is 00000000, the second digital signal is 00000001, the third digital signal is 00000010, and so on. Similarly, when i is an even number greater than 10, the rest can be deduced from this.

Figure 3:
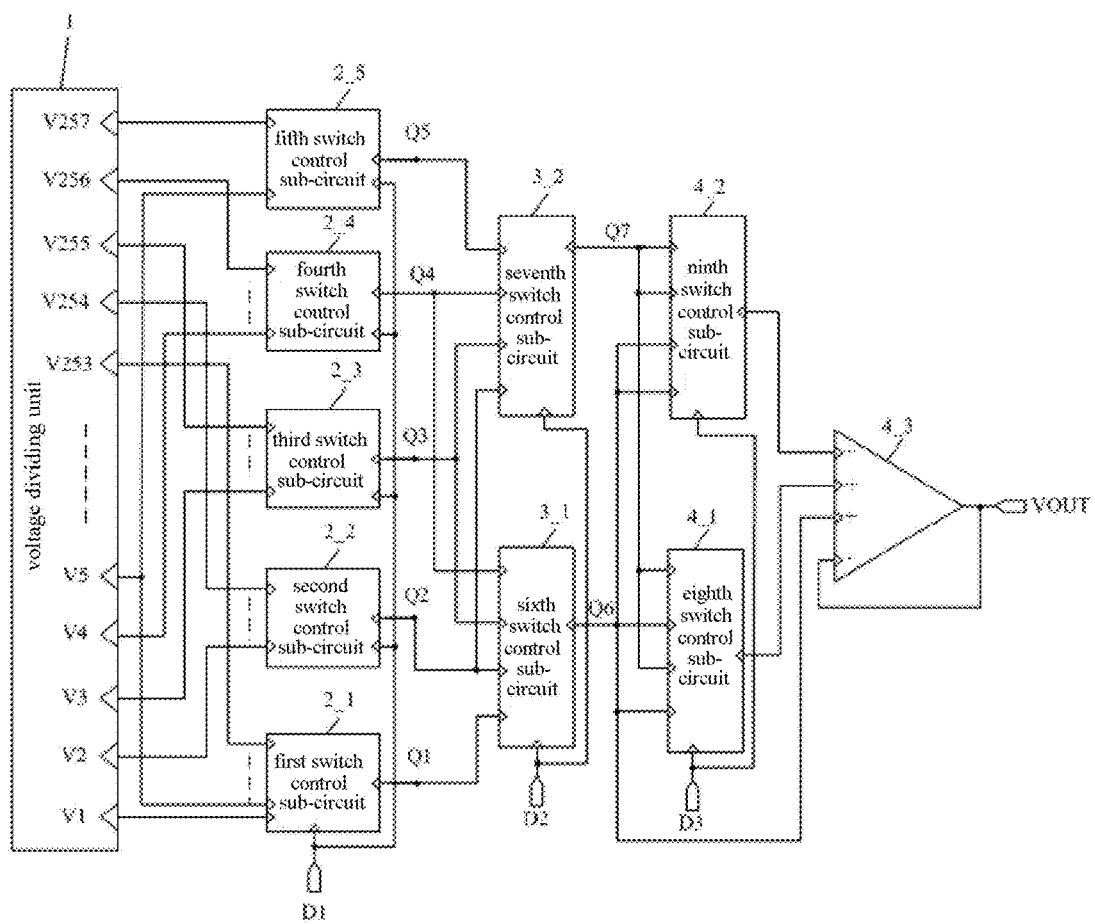
FIG. 3 is another structural schematic diagram of a digital to analog converter circuit provided by an embodiment of this disclosure.

Specifically, in a specific implementation, in the digital to analog converter circuit provided by an embodiment of this disclosure, as shown in FIG. 3 (in FIG. 3, for example i=8), the first segmenting unit comprises: a first switch control sub-circuit 2_1, a second switch control sub-circuit 2_2, a third switch control sub-circuit 2_3, a fourth switch control sub-circuit 2_4 and a fifth switch control sub-circuit 2_5.

First terminals of the first switch control sub-circuit 2_1 are connected in correspondence with the 4 k−3th voltage dividing signal terminal respectively, a second terminal of the first switch control sub-circuit 2_1 is connected with the first digital signal terminal D1, and an output terminal of the first switch control sub-circuit 2_1 is connected with the first node Q1. The first switch control sub-circuit 2_1 is configured to, under control of the kth digital signal received at the second terminal of the first switch control sub-circuit 2_1, provide a signal of the 4 k−3th voltage dividing signal terminal to the first node Q1.

First terminals of the second switch control sub-circuit 2_2 are connected in correspondence with the 4 k−2th voltage dividing signal terminal respectively, a second terminal of the second switch control sub-circuit 2_2 is connected with the first digital signal terminal D1, and an output terminal of the second switch control sub-circuit 2_2 is connected with the second node Q2. The second switch control sub-circuit 2_2 is configured to, under control of the kth digital signal received at the second terminal of the second switch control sub-circuit 2_2, provide a signal of the 4 k−2th voltage dividing signal terminal to the second node Q2.

First terminals of the third switch control sub-circuit 2_3 are connected in correspondence with the 4 k−1th voltage dividing signal terminal respectively, a second terminal of the third switch control sub-circuit 2_3 is connected with the first digital signal terminal D1, and an output terminal of the third switch control sub-circuit 2_3 is connected with the third node Q3. The third switch control sub-circuit 2_3 is configured to, under control of the kth digital signal received at the second terminal of the third switch control sub-circuit 2_3, provide a signal of the 4 k−1th voltage dividing signal terminal to the third node Q3.

First terminals of the fourth switch control sub-circuit 2_4 are connected in correspondence with the 4 kth voltage dividing signal terminal respectively, a second terminal of the fourth switch control sub-circuit 2_4 is connected with the first digital signal terminal D1, and an output terminal of the fourth switch control sub-circuit 2_4 is connected with the fourth node Q4. The fourth switch control sub-circuit 2_4 is configured to, under control of the kth digital signal received at the second terminal of the fourth switch control sub-circuit 2_4, provide a signal of the 4 kth voltage dividing signal terminal to the fourth node Q4.

First terminals of the fifth switch control sub-circuit 2_5 are connected in correspondence with the 4 k+1th voltage dividing signal terminal respectively, a second terminal of the fifth switch control sub-circuit 2_5 is connected with the first digital signal D1, and an output terminal of the fifth switch control sub-circuit 2_5 is connected with the fifth node Q5. The fifth switch control sub-circuit 2_5 is configured to, under control of the kth digital signal received at the second terminal of the fifth switch control sub-circuit 2_5, provide a signal of the 4 k+1th voltage dividing signal terminal to the fifth node Q5.

In a specific implementation, in the digital to analog converter circuit provided by an embodiment of this disclosure, for example, i=8, k=1. The first switch control sub-circuit provides the signal of the first voltage dividing signal terminal to the first node under control of the digital signal 000000; the second switch control sub-circuit provides the signal of the second voltage dividing signal terminal to the second node under control of the digital signal 000000; the third switch control sub-circuit provides the signal of the third voltage dividing signal terminal to the third node under control of the digital signal 000000; the fourth switch control sub-circuit provides the signal of the fourth voltage dividing signal terminal to the fourth node under control of the digital signal 000000; the fifth switch control sub-circuit provides the signal of the fifth voltage dividing signal terminal to the fifth node under control of the digital signal 000000. Therefore, the first switch control sub-circuit, the second switch control sub-circuit, the third switch control sub-circuit, the fourth switch control sub-circuit and the fifth switch control sub-circuit output signals of five adjacent voltage dividing signal terminals under the control of the digital signal 000000.

Specifically, in a specific implementation, in the digital to analog converter circuit provided by an embodiment of this disclosure, as shown in FIG. 3, the second segmenting unit comprises: a sixth switch control sub-circuit 3_1 and a seventh switch control sub-circuit 3_2.

A first terminal of the sixth switch control sub-circuit 3_1 is connected with the first node Q1, a second terminal of the sixth switch control sub-circuit 3_1 is connected with the second node Q2, a third terminal of the sixth switch control sub-circuit 3_1 is connected with the third node Q3, a fourth terminal of the sixth switch control sub-circuit 3_1 is connected with the fourth node Q4, a fifth terminal of the sixth switch control sub-circuit 3_1 is connected with the second digital signal terminal D2, and an output terminal of the sixth switch control sub-circuit 3_1 is connected with the sixth node Q6. The sixth switch control sub-circuit 3_1 is configured to, under control of the mth digital signal received at the fifth terminal of the sixth switch control sub-circuit 3_1, provide a signal of the mth terminal of the sixth switch control sub-circuit 3_1 to the sixth node Q6.

A first terminal of the seventh switch control sub-circuit 3_2 is connected with the second node Q2, a second terminal of the seventh switch control sub-circuit 3_2 is connected with the third node Q3, a third terminal of the seventh switch control sub-circuit 3_2 is connected with the fourth node Q4, a fourth terminal of the seventh switch control sub-circuit 3_2 is connected with the fifth node Q5, a fifth terminal of the seventh switch control sub-circuit 3_2 is connected with the second digital signal terminal D2, and an output terminal of the seventh switch control sub-circuit 3_2 is connected with the seventh node Q7. The seventh switch control sub-circuit 3_2 is configured to, under control of the mth digital signal received at the fifth terminal of the seventh switch control sub-circuit 3_2, provide a signal of the mth terminal of the seventh switch control sub-circuit 3_2 to the seventh node Q7.

In a specific implementation, in the digital to analog converter circuit provided by an embodiment of this disclosure, for example, m=1. The sixth switch control sub-circuit provides the signal of the first terminal thereof to the sixth node under control of the digital signal 00, i.e., providing the signal of the first voltage dividing signal terminal to the sixth node. The seventh switch control sub-circuit provides the signal of the first terminal thereof to the seventh node under control of the digital signal 00, i.e., providing the signal of the second voltage dividing signal terminal to the seventh node. Therefore, the sixth switch control sub-circuit and the seventh switch control sub-circuit output signals of two adjacent voltage dividing signal terminals under the control of the digital signal 00.

Specifically, in a specification implementation, in the digital to analog converter circuit provided by an embodiment of this disclosure, as shown in FIG. 3, the third segmenting unit comprises: an eighth switch control sub-circuit 4_1, a ninth switch control sub-circuit 4_2 and an amplifier 4_3.

A first terminal and a third terminal of the eighth switch control sub-circuit 4_1 are connected with the sixth node Q6 respectively, a second terminal and a fourth terminal of the eighth switch control sub-circuit 4_1 are connected with the seventh node Q7 respectively, a fifth terminal of the eighth switch control sub-circuit 4_1 is connected with a third digital signal terminal D3, and an output terminal of the eighth switch control sub-circuit 4_1 is connected with a first non-inverting input terminal of the amplifier 4_3. The eighth switch control sub-circuit 4_1 is configured to, under control of the nth digital signal in a set of 2 bit binary sequences received at the fifth terminal of the eighth switch control sub-circuit 4_1, provides a signal of the nth terminal of the eighth switch control sub-circuit 4_1 to the first non-inverting input terminal, wherein n is an integer greater than or equal to 1 and less than or equal to 4.

A first terminal and a second terminal of the ninth switch control sub-circuit 4_2 are connected with the sixth node Q6 respectively, a third terminal and a fourth terminal of the ninth switch control sub-circuit 4_2 are connected with the seventh node Q7, a fifth terminal of the ninth switch control sub-circuit 4_2 is connected with the third digital signal terminal D3, and an output terminal of the ninth switch control sub-circuit 4_2 is connected with a second non-inverting input terminal of the amplifier 4_3. The ninth switch control sub-circuit 4_2 is configured to, under control of the nth digital signal in a set of 2 bit binary sequences received at the fifth terminal of the ninth switch control sub-circuit 4_2, provide a signal of the nth terminal of the ninth switch control sub-circuit 4_2 to the second non-inverting input terminal.

A third non-inverting input terminal of the amplifier 4_3 is connected with the sixth node Q6, an inverting input terminal of the amplifier 4_3 is connected with an output terminal of the amplifier 4_3 and the analog signal output terminal VOUT respectively. The amplifier 4_3 is configured to add a voltage of a signal of the first non-inverting input terminal, a voltage of a signal of the second non-inverting input terminal and a voltage of a signal of the third non-inverting input terminal according to a preset sum rule, so as to output four analog signals with different voltages corresponding to the signal of the third non-inverting input terminal.

In a specific implementation, in the digital to analog converter circuit provided by an embodiment of this disclosure, the amplifier is a rail to rail amplifier with three inputs. A width to length ratio (W/L) of a channel of a thin film transistor of the first non-inverting input terminal: a width to length ratio (W/L) of a channel of a thin film transistor of the second non-inverting input terminal: a width to length ratio (W/L) of a channel of a thin film transistor of the third non-inverting input terminal is 1:2:1. Taking the example that the voltage of the first non-inverting input terminal of the amplifier is Ve1, the voltage of the second non-inverting input terminal is Ve2, and the voltage of the third non-inverting input terminal is Ve3, the amplifier is configured to add the voltage of the first non-inverting input terminal, the voltage of the second no-inverting input terminal and the voltage of the third non-inverting input terminal according to a preset sum rule of ¼Ve1+½Ve2+¼Ve3, so as to output four analog signals with different voltages corresponding to the signal of the third non-inverting input terminal.

In a specific implementation, in the digital to analog converter circuit provided by an embodiment of this disclosure, taking the example that n=1, the voltage of the signal of the first voltage dividing signal terminal is $V_{f1}$, the signal of the second voltage dividing signal terminal is $V_{f2}$, the eighth switch control sub-circuit provides the signal of the first terminal thereof to the first non-inverting input terminal under control of the digital signal 00, i.e., providing the signal of the first voltage dividing signal terminal to the first non-inverting input terminal, then the voltage Ve1 of the first non-inverting input terminal of the amplifier is $V_{f1}$. The ninth switch control sub-circuit provides the signal of the first terminal thereof to the second non-inverting input terminal under control of the digital signal 00, i.e., providing the signal of the first voltage dividing signal terminal to the second non-inverting input terminal, then the voltage Ve2 of the second non-inverting input terminal of the amplifier is $V_{f1}$, and the voltage of the third non-inverting input terminal of the amplifier is $V_{f1}$. Hence, the amplifier outputs an analog signal whose voltage is $V_{f1}$ according to ¼Ve1+½Ve2+¼Ve3. Similarly, when the digital signal inputted into the eighth switch control sub-circuit and the ninth switch control sub-circuit is 01, the amplifier outputs an analog signal whose voltage is ¾$V_{f1}$+¼$V_{f2}$. When the digital signal inputted into the eighth switch control sub-circuit and the ninth switch control sub-circuit is 10, the amplifier outputs an analog signal whose voltage is ½$V_{f1}$+½$V_{f2}$. When the digital signal inputted into the eighth switch control sub-circuit and the ninth switch control sub-circuit is 11, the amplifier outputs an analog signal whose voltage is ¼V$_{f1}$+¾V$_{f2}$. Therefore, the voltage of the first voltage dividing signal terminal can be correspondingly divided to output four analog signals of different voltages under control of a digital signal: V$_{f1}$, ¾V$_{f1}$+¼V$_{f2}$, ½V$_{f1}$+½V$_{f2}$, ¼V$_{f1}$+¾V$_{f2}$.

Similarly, in a specific implementation, the voltage of the second voltage dividing signal terminal can be correspondingly divided to output four analog signals of different voltages under control of a digital signal, the voltage of the third voltage dividing signal terminal can be correspondingly divided to output four analog signals of different voltages under control of a digital signal, and so on, until the voltage of the 256th voltage dividing signal terminal is correspondingly divided to output four analog signals of different voltages under control of a digital signal. Thereby, 1024 analog signals of different voltages can be obtained, so as to enable the digital to analog converter circuit provided by an embodiment of this disclosure to realize 10 bit DAC precision.

Next, the digital to analog converter circuit provided by an embodiment of this disclosure will be explained in detail in conjunction with a specific embodiment by taking i=8 as an example. It should be noted that this embodiment is for explaining this disclosure better rather than limiting this disclosure.

Specifically, in a specific implementation, in the digital to analog converter circuit provided by an embodiment of this disclosure, as shown in FIG. 2 and FIG. 3, the voltage dividing unit 1 has 257 voltage dividing signal terminals, which are defined as 1st to 257th voltage dividing signal terminals V1~V257 according to the voltage from low to high successively.

Figure 4:
FIG. 4 is a schematic diagram of a specific structure of a voltage dividing unit of a digital to analog converter circuit provided by an embodiment of this disclosure.

Specifically, in a specific implementation, in the digital to analog converter circuit provided by an embodiment of this disclosure, as shown in FIG. 4, the voltage dividing unit comprises a resistor string 1_1 with 256 resistors R1~R256 connected in series, a high potential reference voltage terminal V$_{refh}$ and a low potential reference signal terminal V$_{rehl}$. The resistor string 1_1 comprises 257 series nodes, which are defined as 1st to 257th series nodes v1~v257 according to the voltage from low to high successively. The first series node v1 is connected with the low potential reference signal terminal V$_{rehl}$, the 257th series node v257 is connected with the high potential reference voltage terminal V$_{refh}$, and the 1st to the 257th series nodes v1~v257 are connected in correspondence with the 1st to 257th voltage dividing signal terminals.

In a specific implementation, in the digital to analog converter circuit provided by an embodiment of this disclosure, the low potential reference signal terminal is a ground terminal. Certainly, the low potential reference signal terminal can also be a signal terminal with other voltages, which can be set based on actual requirements of the digital to analog converter circuit, and will not be defined here.

In a specific implementation, in the digital to analog converter circuit provided by an embodiment of this disclosure, the resistance value of each resistor is equal.

Figure 5A:
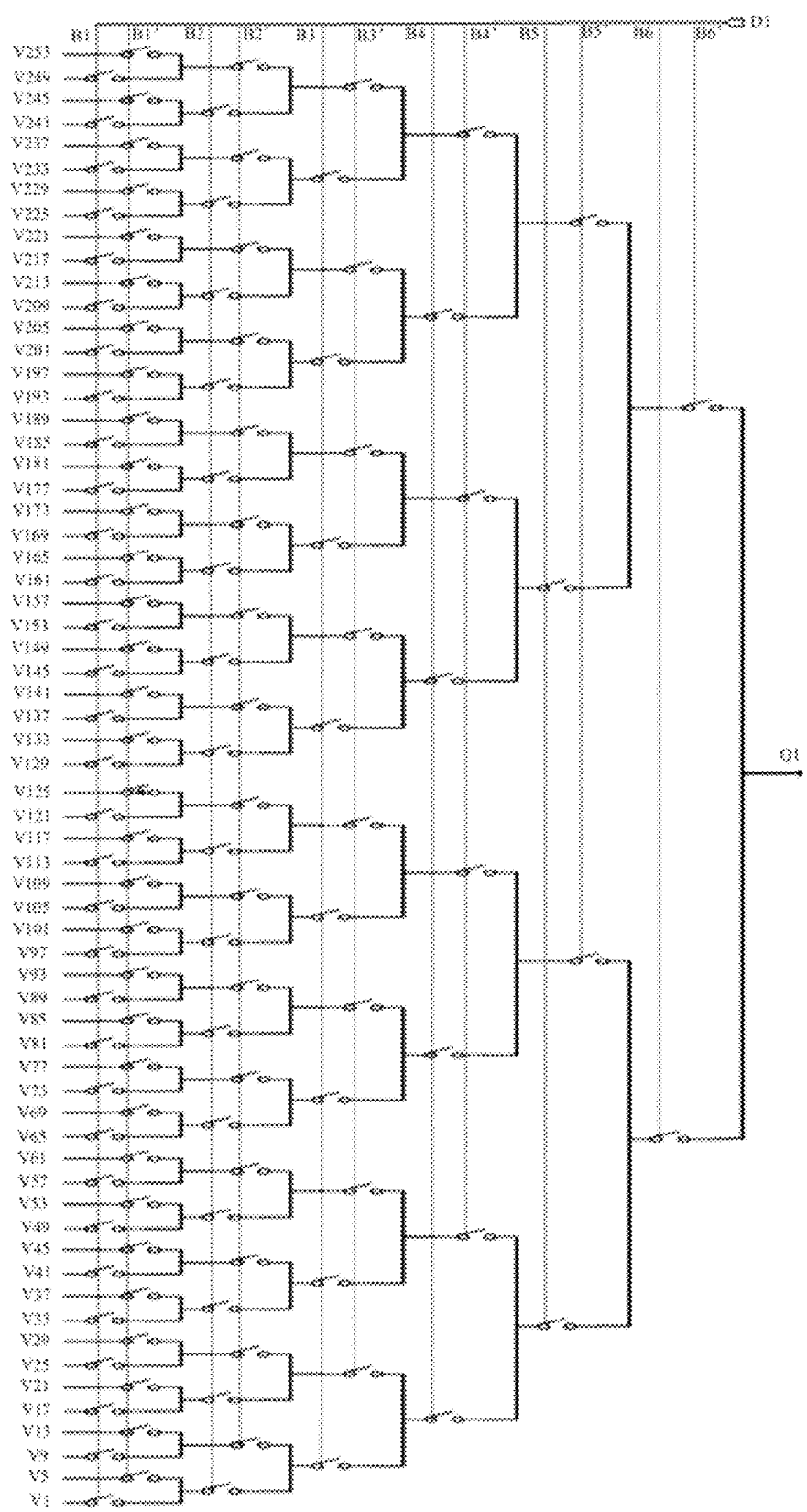
FIG. 5a is a schematic diagram of a specific structure of a first switch control sub-circuit of a digital to analog converter circuit provided by an embodiment of this disclosure.

Specifically, in a specific implementation, in the digital to analog converter circuit provided by an embodiment of this disclosure, as shown in FIG. 5a (in FIG. 5a, for example, i=8), the first switch control sub-circuit comprises a first switch network of an i−2 bit binary switch tree type.

First input terminals of the first switch network are connected in correspondence with the 4 k−3th voltage dividing signal terminals, a second input terminal of the first switch network is connected with the first digital signal terminal D1, and an output terminal of the first switch network is connected with the first node Q1.

In a specific implementation, in the digital to analog converter circuit provided by an embodiment of this disclosure, as shown in FIG. 5a, the 4 k−3th voltage dividing signal terminals are respectively: the first voltage dividing signal terminal V1, the fifth voltage dividing signal terminal V5, the ninth voltage dividing signal terminal V9 . . . the 249th voltage dividing signal terminal V249, the 253th voltage dividing signal terminal V253. The first switch network provides the signal of the 4 k−3th voltage dividing signal terminal to the first node Q1 under control of the kth digital signal in a set of 6 bit binary sequences. B1 represents 0, B1' represents 1; B2 represents 0, B2' represents 1; B3 represents 0, B3' represents 1; B4 represents 0, B4' represents 1; B5 represents 0, B5' represents 1; B6 represents 0, B6' represents 1. Moreover, a switch is turned on at 0 and cut off at 1.

In a specific implementation, in the digital to analog converter circuit provided by an embodiment of this disclosure, as shown in FIG. 5a, for example, k=1, the first switch network provides the signal of the first voltage dividing signal terminal V1 to the first node Q1 under control of the first digital signal 000000.

The above is only illustration of a specific structure of the first switch control sub-circuit in the digital to analog converter circuit provided by an embodiment of this disclosure. In a specific implementation, the specific structure of the first switch control sub-circuit is not limited to the above structure provided by an embodiment of this disclosure, and it can also be other structures known by the skilled person in the art, which will not be defined here.

Figure 5B:
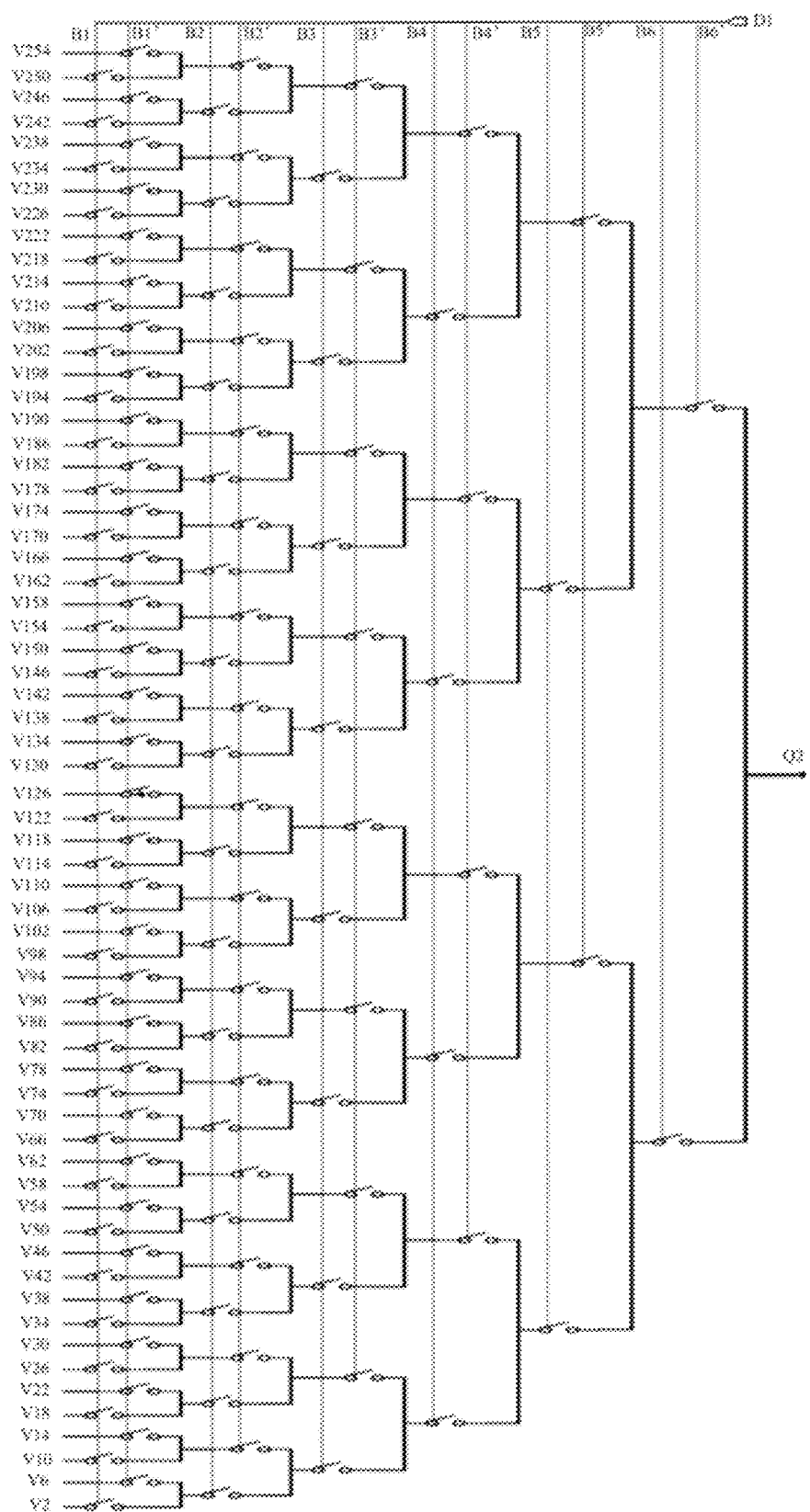
FIG. 5b is a schematic diagram of a specific structure of a second switch control sub-circuit of a digital to analog converter circuit provided by an embodiment of this disclosure.

Specifically, in a specific implementation, in the digital to analog converter circuit provided by an embodiment of this disclosure, as shown in FIG. 5b (in FIG. 5b, for example, i=8), the second switch control sub-circuit comprises a second switch network of an i−2 bit binary switch tree type.

First input terminals of the second switch network are connected in correspondence with the 4 k−2th voltage dividing signal terminal, a second input terminal of the second switch network is connected with the first digital signal terminal D1, and an output terminal of the second switch network is connected with the second node Q2.

In a specific implementation, in the digital to analog converter circuit provided by an embodiment of this disclosure, as shown in FIG. 5b, the 4 k−2th voltage dividing signal terminals are respectively: the second voltage dividing signal terminal V2, the sixth voltage dividing signal terminal V6, the tenth voltage dividing signal terminal V10 . . . the 250th voltage dividing signal terminal V250, the 254th voltage dividing signal terminal V254. The second switch network provides the signal of the 4 k−2th voltage dividing signal terminal to the second node Q2 under control of the kth digital signal in a set of 6 bit binary sequences. B1 represents 0, B1' represents 1; B2 represents 0, B2' represents 1; B3 represents 0, B3' represents 1; B4 represents 0, B4' represents 1; B5 represents 0, B5' represents 1; B6 represents 0, B6' represents 1. Moreover, a switch is turned on at 0 and cut off at 1.

In a specific implementation, in the digital to analog converter circuit provided by an embodiment of this disclosure, as shown in FIG. 5b, for example k=1, the second switch network provides the signal of the second voltage dividing signal terminal V2 to the second node Q2 under control of the first digital signal 000000.

The above is only illustration of a specific structure of the second switch control sub-circuit in the digital to analog converter circuit provided by an embodiment of this disclosure. In a specific implementation, the specific structure of the second switch control sub-circuit is not limited to the above structure provided by an embodiment of this disclosure, and it can also be other structures known by the skilled person in the art, which will not be defined here.

Figure 5C:
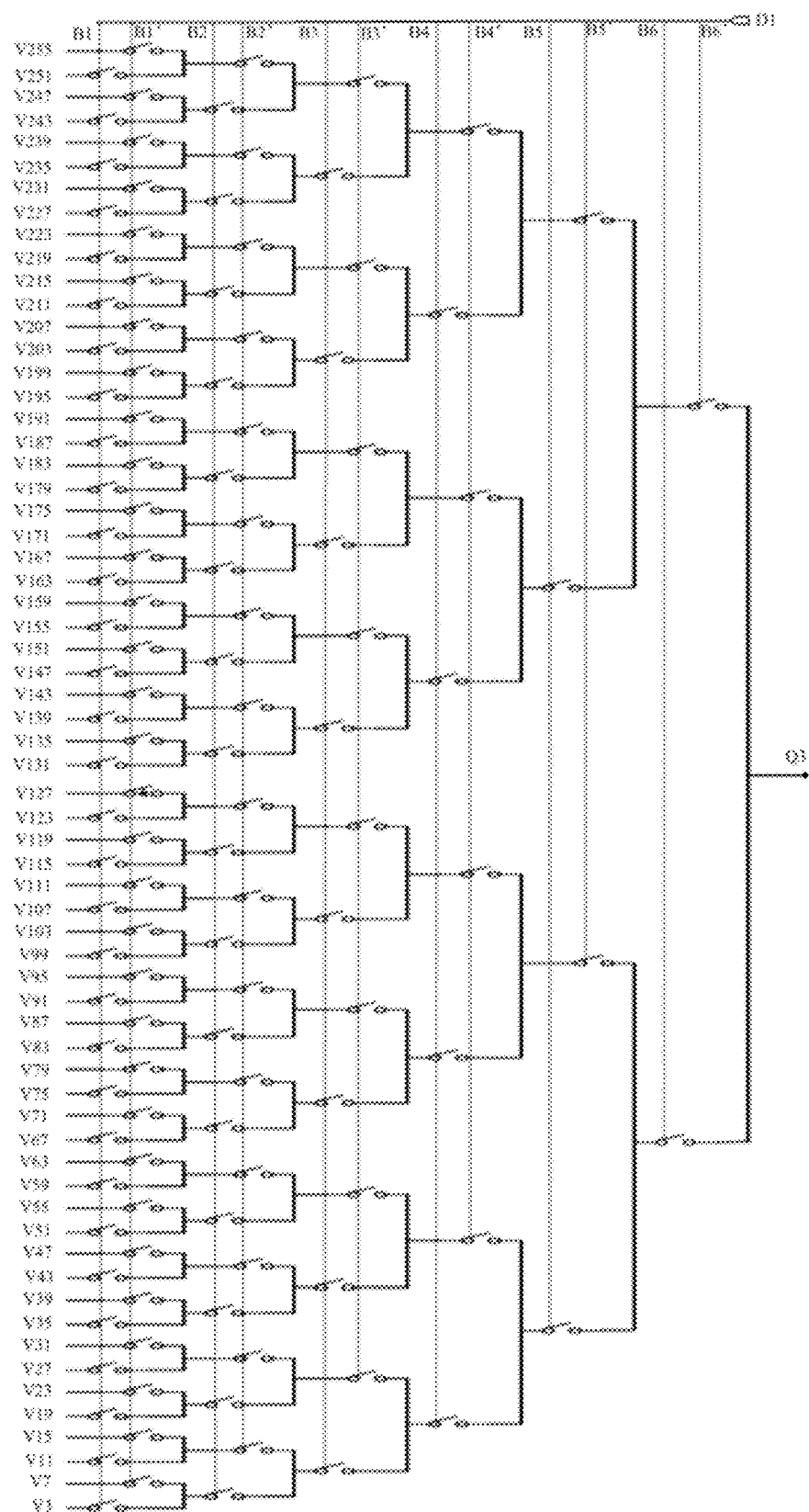
FIG. 5c is a schematic diagram of a specific structure of a third switch control sub-circuit of a digital to analog converter circuit provided by an embodiment of this disclosure.

Specifically, in a specific implementation, in the digital to analog converter circuit provided by an embodiment of this disclosure, as shown in FIG. 5c (in FIG. 5c, for example, i=8), the third switch control sub-circuit comprises a third switch network of an i−2 bit binary switch tree type.

First input terminals of the third switch network are connected in correspondence with the 4 k−1th voltage dividing signal terminal, a second input terminal of the third switch network is connected with the first digital signal terminal D1, and an output terminal of the third switch network is connected with the third node Q3.

In a specific implementation, in the digital to analog converter circuit provided by an embodiment of this disclosure, as shown in FIG. 5c, the 4 k−1th voltage dividing signal terminals are respectively: the third voltage dividing signal terminal V3, the seventh voltage dividing signal terminal V7, the eleventh voltage dividing signal terminal V11 . . . the 251th voltage dividing signal terminal V251, the 255th voltage dividing signal terminal V255. The third switch network provides the signal of the 4 k−1th voltage dividing signal terminal to the third node Q3 under control of the kth digital signal in a set of 6 bit binary sequences. B1 represents 0, BF represents 1; B2 represents 0, B2' represents 1; B3 represents 0, B3' represents 1; B4 represents 0, B4' represents 1; B5 represents 0, B5' represents 1; B6 represents 0, B6' represents 1. Moreover, a switch is turned on at 0 and cut off at 1.

In a specific implementation, in the digital to analog converter circuit provided by an embodiment of this disclosure, as shown in FIG. 5c, for example k=1, the third switch network provides the signal of the third voltage dividing signal terminal V3 to the third node Q3 under control of the first digital signal 000000.

The above is only illustration of a specific structure of the third switch control sub-circuit in the digital to analog converter circuit provided by an embodiment of this disclosure. In a specific implementation, the specific structure of the third switch control sub-circuit is not limited to the above structure provided by an embodiment of this disclosure, and it can also be other structures known by the skilled person in the art, which will not be defined here.

Figure 5D:
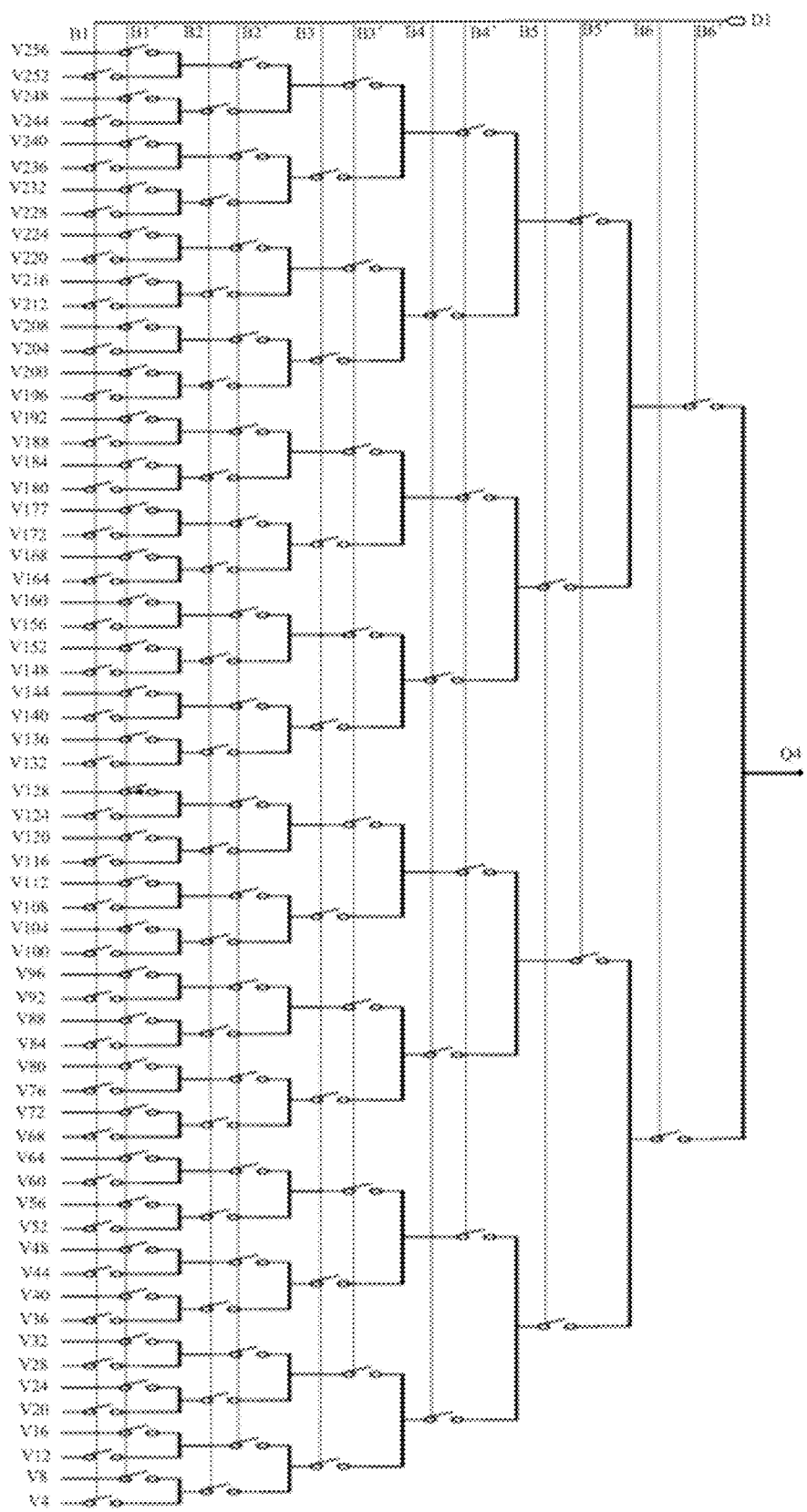
FIG. 5d is a schematic diagram of a specific structure of a fourth switch control sub-circuit of a digital to analog converter circuit provided by an embodiment of this disclosure.

Specifically, in a specific implementation, in the digital to analog converter circuit provided by an embodiment of this disclosure, as shown in FIG. 5d (in FIG. 5d, for example, i=8), the fourth switch control sub-circuit comprises a fourth switch network of an i−2 bit binary switch tree type.

First input terminals of the fourth switch network are connected in correspondence with the 4 kth voltage dividing signal terminal, a second input terminal of the fourth switch network is connected with the first digital signal terminal D1, and an output terminal of the fourth switch network is connected with the fourth node Q4.

In a specific implementation, in the digital to analog converter circuit provided by an embodiment of this disclosure, as shown in FIG. 5d, the 4 kth voltage dividing signal terminals are respectively: the fourth voltage dividing signal terminal V4, the eighth voltage dividing signal terminal V8, the twelfth voltage dividing signal terminal V12 . . . the 252th voltage dividing signal terminal V252, the 256th voltage dividing signal terminal V256. The fourth switch network provides the signal of the 4 kth voltage dividing signal terminal to the fourth node Q4 under control of the kth digital signal in a set of 6 bit binary sequences. B1 represents 0, B1' represents 1; B2 represents 0, B2' represents 1; B3 represents 0, B3' represents 1; B4 represents 0, B4' represents 1; B5 represents 0, B5' represents 1; B6 represents 0, B6' represents 1. Moreover, a switch is turned on at 0 and cut off at 1.

In a specific implementation, in the digital to analog converter circuit provided by an embodiment of this disclosure, as shown in FIG. 5d, for example k=1, the fourth switch network provides the signal of the fourth voltage dividing signal terminal V4 to the fourth node Q4 under control of the first digital signal 000000.

The above is only illustration of a specific structure of the fourth switch control sub-circuit in the digital to analog converter circuit provided by an embodiment of this disclosure. In a specific implementation, the specific structure of the fourth switch control sub-circuit is not limited to the above structure provided by an embodiment of this disclosure, and it can also be other structures known by the skilled person in the art, which will not be defined here.

Figure 5E:
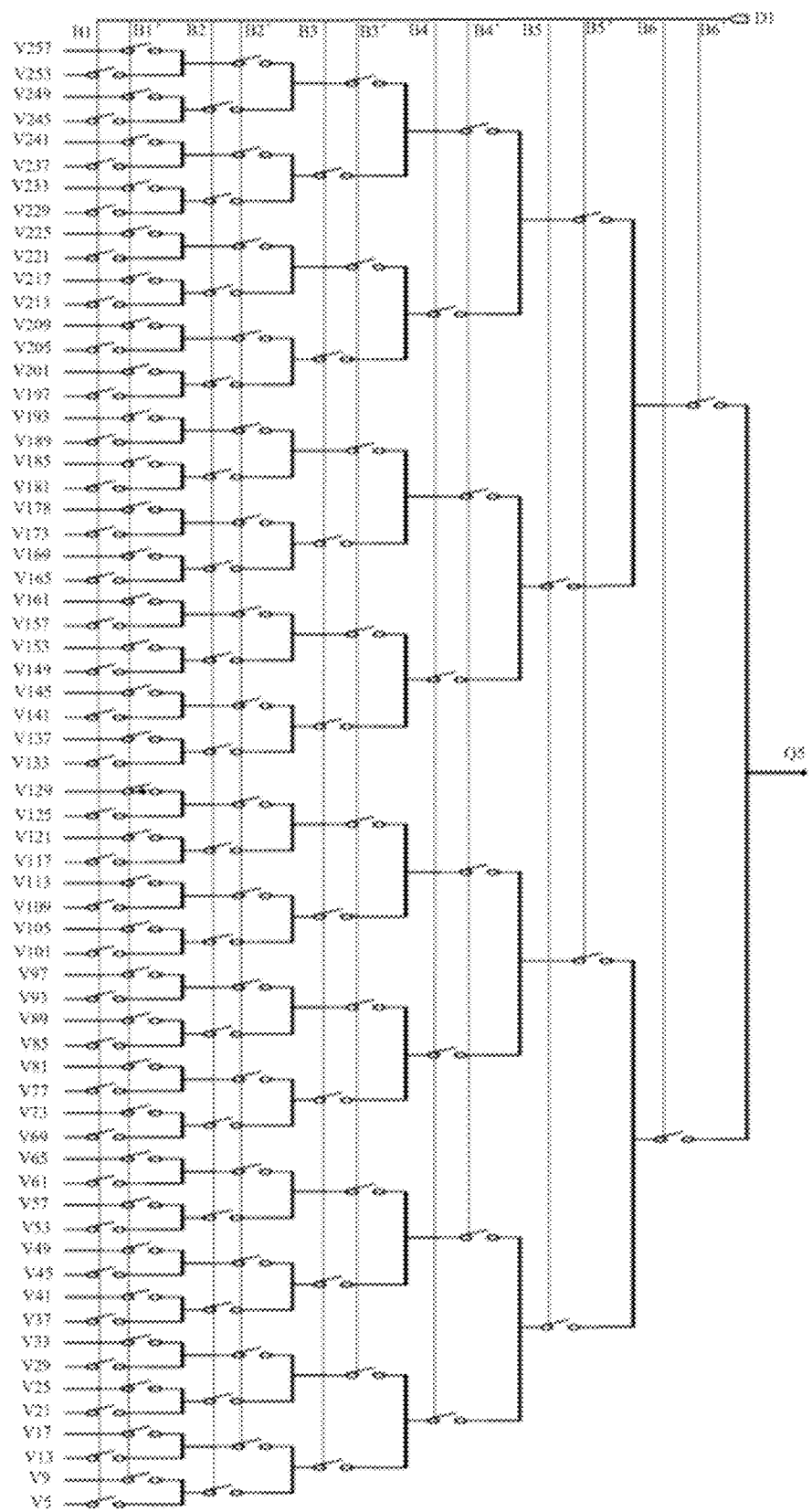
FIG. 5e is a schematic diagram of a specific structure of a fifth switch control sub-circuit of a digital to analog converter circuit provided by an embodiment of this disclosure.

Specifically, in a specific implementation, in the digital to analog converter circuit provided by an embodiment of this disclosure, as shown in FIG. 5e (in FIG. 5e, for example, i=8), the fifth switch control sub-circuit comprises a fifth switch network of an i−2 bit binary switch tree type. First input terminals of the fifth switch network are connected in correspondence with the 4 k+1th voltage dividing signal terminal, a second input terminal of the fifth switch network is connected with the first digital signal terminal D1, and an output terminal of the fifth switch network is connected with the fifth node Q5.

In a specific implementation, in the digital to analog converter circuit provided by an embodiment of this disclosure, as shown in FIG. 5e, the 4 k+1th voltage dividing signal terminals are respectively: the fifth voltage dividing signal terminal V5, the ninth voltage dividing signal terminal V9, the thirteenth voltage dividing signal terminal V13 . . . the 253th voltage dividing signal terminal V253, the 257th voltage dividing signal terminal V257. The fifth switch network provides the signal of the 4 k+1th voltage dividing signal terminal to the fifth node Q5 under control of the kth digital signal in a set of 6 bit binary sequences. B1 represents 0, BF represents 1; B2 represents 0, B2' represents 1; B3 represents 0, B3' represents 1; B4 represents 0, B4' represents 1; B5 represents 0, B5' represents 1; B6 represents 0, B6' represents 1. Moreover, a switch is turned on at 0 and cut off at 1.

In a specific implementation, in the digital to analog converter circuit provided by an embodiment of this disclosure, as shown in FIG. 5e, for example k=1, the fifth switch network provides the signal of the fifth voltage dividing signal terminal V5 to the fifth node Q5 under control of the first digital signal 000000.

The above is only illustration of a specific structure of the fifth switch control sub-circuit in the digital to analog converter circuit provided by an embodiment of this disclosure. In a specific implementation, the specific structure of the fifth switch control sub-circuit is not limited to the above structure provided by an embodiment of this disclosure, and it can also be other structures known by the skilled person in the art, which will not be defined here.

Figure 6A:
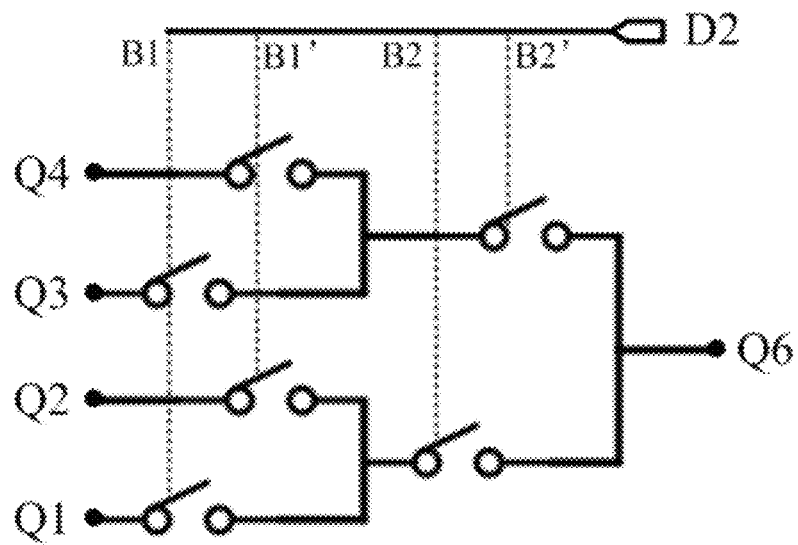
FIG. 6a a schematic diagram of a specific structure of a sixth switch control sub-circuit of a digital to analog converter circuit provided by an embodiment of this disclosure.

Specifically, in a specific implementation, in the digital to analog converter circuit provided by an embodiment of this disclosure, as shown in FIG. 6a, the sixth switch control sub-circuit comprises a sixth switch network of a 2 bit binary switch tree type.

First input terminals of the sixth switch network are connected in correspondence with the first node Q1, the second node Q2, the third node Q3 and the fourth node Q4, a second input terminal of the sixth switch network is connected with the second digital signal terminal D2, and an output terminal of the sixth switch network is connected with the sixth node Q6.

In a specific implementation, in the digital to analog converter circuit provided by an embodiment of this disclosure, as shown in FIG. 6a, the sixth switch network provides the signal of the mth terminal to the sixth node Q6 under control of the mth digital signal in a set of 2 bit binary sequences. B1 represents 0, B1' represents 1; B2 represents 0, B2' represents 1. Moreover, a switch is turned on at 0 and cut off at 1.

In a specific implementation, in the digital to analog converter circuit provided by an embodiment of this disclosure, as shown in FIG. 6a, for example m=1, the sixth switch network provides the signal of the first node Q1 to the sixth node Q6 under control of the first digital signal 00, i.e., providing the signal of the first voltage dividing signal terminal to the sixth node Q6.

The above is only illustration of a specific structure of the sixth switch control sub-circuit in the digital to analog converter circuit provided by an embodiment of this disclosure. In a specific implementation, the specific structure of the sixth switch control sub-circuit is not limited to the above structure provided by an embodiment of this disclosure, and it can also be other structures known by the skilled person in the art, which will not be defined here.

Figure 6B:
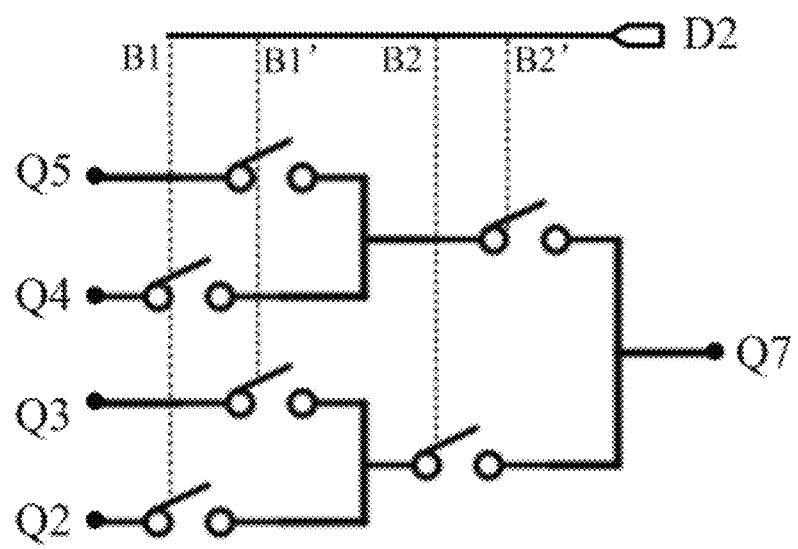
FIG. 6b is a schematic diagram of a specific structure of a seventh switch control sub-circuit of a digital to analog converter circuit provided by an embodiment of this disclosure.

Specifically, in a specific implementation, in the digital to analog converter circuit provided by an embodiment of this disclosure, as shown in FIG. 6b, the seventh switch control sub-circuit comprises a seventh switch network of a 2 bit binary switch tree type.

First input terminals of the seventh switch network are connected in correspondence with the second node Q2, the third node Q3, the fourth node Q4 and the fifth node Q5, a second input terminal of the seventh switch network is connected with the second digital signal terminal D2, and an output terminal of the seventh switch network is connected with the seventh node Q7.

In a specific implementation, in the digital to analog converter circuit provided by an embodiment of this disclosure, as shown in FIG. 6b, the seventh switch network provides the signal of the mth terminal to the seventh node Q7 under control of the mth digital signal in a set of 2 bit binary sequences. B1 represents 0, B1' represents 1; B2 represents 0, B2' represents 1. Moreover, a switch is turned on at 0 and cut off at 1.

In a specific implementation, in the digital to analog converter circuit provided by an embodiment of this disclosure, as shown in FIG. 6b, for example m=1, the seventh switch network provides the signal of the second node Q2 to the seventh node Q7 under control of the first digital signal 00, i.e., providing the signal of the second voltage dividing signal terminal to the seventh node Q7.

The above is only illustration of a specific structure of the seventh switch control sub-circuit in the digital to analog converter circuit provided by an embodiment of this disclosure. In a specific implementation, the specific structure of the seventh switch control sub-circuit is not limited to the above structure provided by an embodiment of this disclosure, and it can also be other structures known by the skilled person in the art, which will not be defined here.

Figure 7:
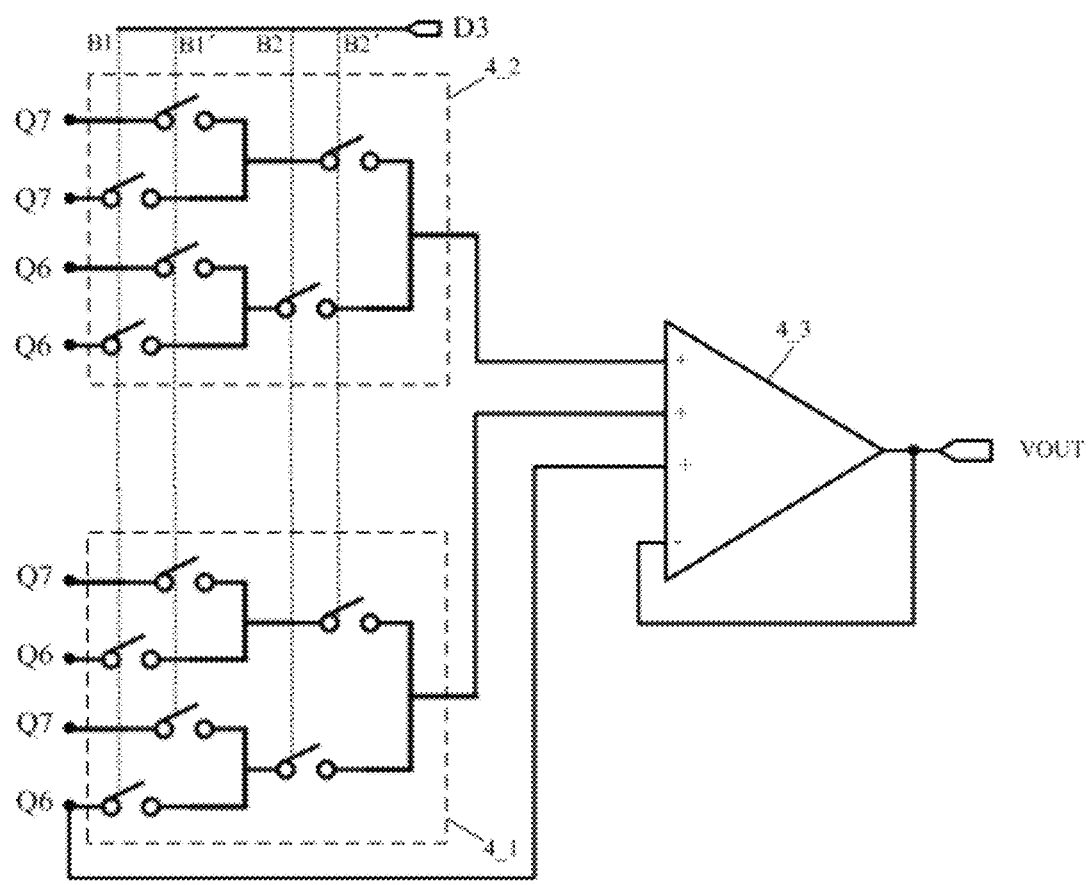
FIG. 7 is a schematic diagram of a specific structure of a third segmenting unit of a digital to analog converter circuit provided by an embodiment of this disclosure.

Specifically, in a specific implementation, in the digital to analog converter circuit provided by an embodiment of this disclosure, as shown in FIG. 7, the eighth switch control sub-circuit 4_1 comprises an eighth switch network of a 2 bit binary switch tree type.

A first input terminal and a third input terminal of the eighth switch network are connected in correspondence with the sixth node Q6 respectively, a second input terminal and a fourth input terminal of the eighth switch network are connected in correspondence with the seventh node Q7 respectively, a fifth input terminal of the eighth switch network is connected with the third digital signal terminal D3, and an output terminal of the eighth switch network is connected with the first non-inverting input terminal.

In a specific implementation, in the digital to analog converter circuit provided by an embodiment of this disclosure, as shown in FIG. 7, the eighth switch network provides the signal of the nth terminal to the first non-inverting input terminal of the amplifier 4_3 under control of the nth digital signal in a set of 2 bit binary sequences. B1 represents 0, B1' represents 1; B2 represents 0, B2' represents 1. Moreover, a switch is turned on at 0 and cut off at 1.

In a specific implementation, in the digital to analog converter circuit provided by an embodiment of this disclosure, as shown in FIG. 7, for example n=1, the eighth switch network provides the signal of the first input terminal thereof (i.e., the sixth node Q6) to the first non-inverting input terminal of the amplifier 4_3 under control of the first digital signal 00, i.e., providing the signal of the first voltage dividing signal terminal to the first non-inverting input terminal of the amplifier 4_3.

The above is only illustration of a specific structure of the eighth switch control sub-circuit in the digital to analog converter circuit provided by an embodiment of this disclosure. In a specific implementation, the specific structure of the eighth switch control sub-circuit is not limited to the above structure provided by an embodiment of this disclosure, and it can also be other structures known by the skilled person in the art, which will not be defined here.

Specifically, in a specific implementation, in the digital to analog converter circuit provided by an embodiment of this disclosure, as shown in FIG. 7, the ninth switch control sub-circuit 4_2 comprises a ninth switch network of a 2 bit binary switch tree type.

A first input terminal and a second input terminal of the ninth switch network are connected in correspondence with the sixth node Q6 respectively, a third input terminal and a fourth input terminal of the ninth switch network are connected in correspondence with the seventh node Q7 respectively, a fifth input terminal of the ninth switch network is connected with the third digital signal terminal D3, and an output terminal of the ninth switch network is connected with the second non-inverting input terminal.

In a specific implementation, in the digital to analog converter circuit provided by an embodiment of this disclosure, as shown in FIG. 7, the ninth switch network provides the signal of the nth terminal to the second non-inverting input terminal of the amplifier 4_3 under control of the nth digital signal in a set of 2 bit binary sequences. B1 represents 0, B1' represents 1; B2 represents 0, B2' represents 1. Moreover, a switch is turned on at 0 and cut off at 1.

In a specific implementation, in the digital to analog converter circuit provided by an embodiment of this disclosure, as shown in FIG. 7, for example n=1, the ninth switch network provides the signal of the first input terminal thereof (i.e., the sixth node Q6) to the second non-inverting input terminal of the amplifier 4_3 under control of the first digital signal 00, i.e., providing the signal of the first voltage dividing signal terminal to the second non-inverting input terminal.

The above is only illustration of a specific structure of the ninth switch control sub-circuit in the digital to analog converter circuit provided by an embodiment of this disclosure. In a specific implementation, the specific structure of the ninth switch control sub-circuit is not limited to the above structure provided by an embodiment of this disclosure, and it can also be other structures known by the skilled person in the art, which will not be defined here.

Generally, a switch network of a binary switch tree type refers to a network constituted by switches that are connected in a tree shape. In a specific implementation, in the digital to analog converter circuit provided by an embodiment of this disclosure, the switch network of an i−2 bit binary switch tree type is constituted by $2^{i-2}+2^{i-3}+2^{i-4}+\ldots+2^1$ switches connected in a tree shape.

Specifically, in a specific implementation, in the digital to analog converter circuit provided by an embodiment of this disclosure, as shown in FIG. 5a to FIG. 5e, individual switch networks of 6 bit binary switch tree type are constituted by $2^6+2^5+2^4+2^3+2^2+2^1$ switches connected in a tree shape respectively.

Specifically, in a specific implementation, in the digital to analog converter circuit provided by an embodiment of this disclosure, as shown in FIG. 6a to FIG. 7, individual switch networks of 2 bit binary switch tree type are constituted by $2^2+2^1$ switches connected in a tree shape respectively.

Specifically, in a specific implementation, in the digital to analog converter circuit provided by an embodiment of this disclosure, all the switches are CMOS transmission gate structures. In this way, it can be ensured that the transmitted signal voltage has no distortion when transmitting the signal voltage.

Next, a working process of the digital to analog converter circuit provided by an embodiment of this disclosure will be described by taking the example that i=8 and each switch control sub-circuit comprises a switch network.

An exemplary embodiment will be explained by taking the example that the first digital signal terminal provides the first digital signal 000000 in a set of 6 bit binary sequences, the second digital signal terminal provides the first digital signal 00 in a set of 2 bit binary sequences, and the third digital signal terminal provides the first digital signal 00 in a set of 2 bit binary sequences.

Under control of the digital signal 000000, the first switch network provides the signal of the first voltage dividing signal terminal to the first node, then the voltage of the signal of the first node is $V_{f1}$; the second switch network provides the signal of the second voltage dividing signal terminal to the second node, then the voltage of the signal of the second node is $V_{f2}$; the third switch network provides the signal of the third voltage dividing signal terminal to the third node, then the voltage of the signal of the third node is $V_{f3}$; the fourth switch network provides the signal of the fourth voltage dividing signal terminal to the fourth node, then the voltage of the signal of the fourth node is $V_{f4}$; the fifth switch network provides the signal of the fifth voltage dividing signal terminal to the fifth node, then the voltage of the signal of the fifth node is $V_{f5}$.

Under control of the digital signal 00, the sixth switch network provides the signal of the first node to the sixth node, then the voltage of the signal of the sixth node is $V_{f1}$; the seventh switch network provides the signal of the second node to the seventh node, then the voltage of the signal of the seventh node is $V_{f2}$.

Under control of the digital signal 00, the eighth switch network provides the signal of the sixth node to the first non-inverting input terminal of the amplifier, then the voltage Ve1 of the first non-inverting input terminal of the amplifier is $V_{f1}$; the ninth switch network provides the signal of the sixth node to the second non-inverting input terminal of the amplifier, then the voltage Ve2 of the second non-inverting input terminal of the amplifier is $V_{f1}$. The voltage Ve3 of the third non-inverting input terminal of the amplifier is $V_{f1}$. Hence, the amplifier adds the voltage Ve1 of its first non-inverting input terminal, the voltage Ve2 of its second non-inverting input terminal and the voltage Ve3 of its third non-inverting input terminal according to ¼Ve1+½Ve2+¼Ve3, so as to output the analog signal of $V_{f1}$.

Another exemplary embodiment will be explained by taking the example that the first digital signal provides the first digital signal 000000 in a set of 6 bit binary sequences, the second digital signal terminal provides the first digital signal 00 in a set of 2 bit binary sequences, and the third digital signal terminal provides the second digital signal 01 in a set of 2 bit binary sequences.

Under control of the digital signal 000000, the first switch network provides the signal of the first voltage dividing signal terminal to the first node, then the voltage of the signal of the first node is $V_{f1}$; the second switch network provides the signal of the second voltage dividing signal terminal to the second node, then the voltage of the signal of the second node is $V_{f2}$; the third switch network provides the signal of the third voltage dividing signal terminal to the third node, then the voltage of the signal of the third node is $V_{f3}$; the fourth switch network provides the signal of the fourth voltage dividing signal terminal to the fourth node, then the voltage of the signal of the fourth node is $V_{f4}$; the fifth switch network provides the signal of the fifth voltage dividing signal terminal to the fifth node, then the voltage of the signal of the fifth node is $V_{f5}$.

Under control of the digital signal 00, the sixth switch network provides the signal of the first node to the sixth node, then the voltage of the signal of the sixth node is $V_{f1}$; the seventh switch network provides the signal of the second node to the seventh node, then the voltage of the signal of the seventh node is $V_{f2}$.

Under control of the digital signal 01, the eighth switch network provides the signal of the seventh node to the first non-inverting input terminal of the amplifier, then the voltage Ve1 of the first non-inverting input terminal of the amplifier is $V_{f2}$; the ninth switch network provides the signal of the sixth node to the second non-inverting input terminal of the amplifier under control of the digital signal 01, then the voltage Ve2 of the second non-inverting input terminal of the amplifier is $V_{f1}$. The voltage Ve3 of the third non-inverting input terminal of the amplifier is $V_{f1}$. Hence, the amplifier adds the voltage Ve1 of its first non-inverting input terminal, the voltage Ve2 of its second non-inverting input terminal and the voltage Ve3 of its third non-inverting input terminal according to ¼Ve1+½Ve2+¼Ve3, so as to output the analog signal of ¾$V_{f1}$+¼$V_{f2}$.

A further exemplary embodiment will be explained by taking the example that the first digital signal terminal provides the first digital signal 000000 in a set of 6 bit binary sequences, the second digital signal terminal provides the first digital signal 00 in a set of 2 bit binary sequences, and the third digital signal terminal provides the third digital signal 10 in a set of 2 bit binary sequences.

Under control of the digital signal 000000, the first switch network provides the signal of the first voltage dividing signal terminal to the first node, then the voltage of the signal of the first node is $V_{f1}$; the second switch network provides the signal of the second voltage dividing signal terminal to the second node, then the voltage of the signal of the second node is $V_{f2}$; the third switch network provides the signal of the third voltage dividing signal terminal to the third node, then the voltage of the signal of the third node is $V_{f3}$; the fourth switch network provides the signal of the fourth voltage dividing signal terminal to the fourth node, then the voltage of the signal of the fourth node is $V_{f4}$; the fifth switch network provides the signal of the fifth voltage dividing signal terminal to the fifth node, then the voltage of the signal of the fifth node is $V_{f5}$.

Under control of the digital signal 00, the sixth switch network provides the signal of the first node to the sixth node, then the voltage of the signal of the sixth node is $V_{f1}$; the seventh switch network provides the signal of the second node to the seventh node, then the voltage of the signal of the seventh node is $V_{f2}$.

Under control of the digital signal 10, the eighth switch network provides the signal of the sixth node to the first non-inverting input terminal of the amplifier, then the voltage Ve1 of the first non-inverting input terminal of the amplifier is $V_{f1}$; the ninth switch network provides the signal of the seventh node to the second non-inverting input terminal of the amplifier under control of the digital signal 10, then the voltage Ve2 of the second non-inverting input terminal of the amplifier is $V_{f2}$. The voltage Ve3 of the third non-inverting input terminal of the amplifier is $V_{f1}$. Hence, the amplifier adds the voltage Ve1 of its first non-inverting input terminal, the voltage Ve2 of its second non-inverting input terminal and the voltage Ve3 of its third non-inverting input terminal according to ¼Ve1+½V2+¼Ve3, so as to output the analog signal of ½$V_{f1}$+½$V_{f2}$.

An additional exemplary embodiment will be explained by taking the example that the first digital signal terminal provides the first digital signal 000000 in a set of 6 bit binary sequences, the second digital signal terminal provides the first digital signal 00 in a set of 2 bit binary sequences, and the third digital signal terminal provides the fourth digital signal 11 in a set of 2 bit binary sequences.

Under control of the digital signal 000000, the first switch network provides the signal of the first voltage dividing signal terminal to the first node, then the voltage of the signal of the first node is $V_{f1}$; the second switch network provides the signal of the second voltage dividing signal terminal to the second node, then the voltage of the signal of the second node is $V_{f2}$; the third switch network provides the signal of the third voltage dividing signal terminal to the third node, then the voltage of the signal of the third node is $V_{f3}$; the fourth switch network provides the signal of the fourth voltage dividing signal terminal to the fourth node, thus the voltage of the signal of the fourth node is $V_{f4}$; the fifth switch network provides the signal of the fifth voltage dividing signal terminal to the fifth node, then the voltage of the signal of the fifth node is $V_{f5}$.

Under control of the digital signal 00, the sixth switch network provides the signal of the first node to the sixth node, then the voltage of the signal of the sixth node is $V_{f1}$; the seventh switch network provides the signal of the second node to the seventh node, then the voltage of the signal of the seventh node is $V_{f2}$.

Under control of the digital signal 11, the eighth switch network provides the signal of the seventh node to the first non-inverting input terminal of the amplifier, then the voltage Ve1 of the first non-inverting input terminal of the amplifier is $V_{f2}$; the ninth switch network provides the signal of the seventh node to the second non-inverting input terminal of the amplifier under control of the digital signal 10, then the voltage Ve2 of the second non-inverting input terminal of the amplifier is $V_{f2}$. The voltage Ve3 of the third non-inverting input terminal of the amplifier is $V_{f1}$. Hence, the amplifier adds the voltage Ve1 of its first non-inverting input terminal, the voltage Ve2 of its second non-inverting input terminal and the voltage Ve3 of its third non-inverting input terminal according to ¼Ve1+½Ve2+¼Ve3, so as to output the analog signal of ¼$V_{f1}$+¾$V_{f2}$.

From the above exemplary embodiments it can be seen that, when the digital signal inputted at the third digital signal terminal varies from 00, 01, 10, 11 successively, the voltages of the corresponding analog signal outputted by the amplifier are respectively: Vf1, ¾$V_{f1}$+¼$V_{f2}$, ½$V_{f1}$+½$V_{f2}$, ¼$V_{f1}$+¾$V_{f2}$. Moreover, 10 bit DAC precision can be achieved further based on the control of the digital signal of the 6 bit binary sequences inputted at the first digital signal terminal and the control of the digital signal of the 2 bit binary sequences inputted at the second digital signal terminal.

In the digital to analog converter circuit provided by an embodiment of this disclosure, only 257 voltage dividing signal terminals and 654 switches and one amplifier is needed to output 1024 analog signals of different voltages, so as to achieve 10 bit DAC precision and reduce the amount of the switches and the voltage dividing signal terminals, hence, the structure is simplified, the wiring difficulty and the production cost are reduced. Moreover, compared to the 10 bit DAC in the prior art, the area of the digital to analog converter circuit provided by an embodiment of this disclosure is reduced by ⅔, so as to enable the area of the chip provided with the digital to analog converter circuit to be reduced by about ⅓, thereby saving the cost and improving the product competitiveness.

Based on the same inventive concept, an embodiment of this disclosure further provides a display panel, comprising any of the above digital to analog converter circuits provided by an embodiment of this disclosure.

Based on the same inventive concept, an embodiment of this disclosure further provides a display device, comprising the above display panel provided by an embodiment of this disclosure.

At present, the organic electroluminescent display device has the advantages of being super light-weighted, having a wide vision, a low consumption, fast response, vivid color etc., and has been more and more applied in devices such as televisions and tablets. In a specific implementation, in the display device provided by an embodiment of this disclosure, the display device is an organic electroluminescent display device.

Specifically, in a specific implementation, in the display device provided by an embodiment of this disclosure, the display device can be any product or component with display function such as a mobile phone, a tablet, a television, a display, a notebook, a digital photo frame, a navigator. The principle of the display device for solving problems is similar as the preceding digital to analog converter circuit, hence, the implementations of the display device can make reference to the implementations of the preceding digital to analog converter circuit, which will not be repeated here.

In the digital to analog converter circuit, the display panel and the display device provided by embodiments of this disclosure, the digital to analog converter circuit comprises:

a voltage dividing unit, a first segmenting unit, a second segmenting unit and a third segmenting unit. The voltage dividing unit is configured to provide $2^i+1$ voltage dividing signal terminals. The first segmenting unit is configured to, under control of the kth digital signal in a set of i−2 bit binary sequences received at the second terminal thereof, provide the signal of the 4 k−3th voltage dividing signal terminal to the first node, provide the signal of the 4 k−2th voltage dividing signal terminal to the second node, provide the signal of the 4 k−1th voltage dividing signal terminal to the third node, provide the signal of the 4 kth voltage dividing signal terminal to the fourth node, and provide the signal of the 4 k+1th voltage dividing signal terminal to the fifth node, wherein k is an integer greater than or equal to 1 and less than or equal to $2^{i-2}$. The second segmenting unit is configured to, under control of the mth digital signal in a set of 2 bit binary sequences received at the sixth terminal thereof, provide the signal of the mth terminal thereof to the sixth node, and provide the signal of the m+1th terminal thereof to the seventh node, wherein m is an integer greater than or equal to 1 and less than or equal to 4. The third segmenting unit is configured to provide four analog signals with different voltages corresponding to the voltage of the first voltage of the third segmenting unit to the analog signal output terminal. Therefore, the digital to analog converter circuit provided by the embodiment of this disclosure uses a segmentation mode. By means of mutual cooperation of the above four units, only $2^i+1$ voltage dividing signal terminals are required to output $2^{i+2}$ analog signals of different voltages. Compared to the prior art in which $2^{i-2}$ voltage dividing signal terminals are required, the digital to analog converter circuit proposed can reduce the number of the voltage dividing signal terminals, simplify the structure, reduce the wiring difficulty and reduce the production cost.

Apparently, the skilled person in the art can make various amendments and modifications to this disclosure without departing from the spirit and the scope of this disclosure. In this way, provided that these amendments and modifications belong to the scopes of the claims of this disclosure and equivalent technologies thereof, this disclosure also intends to encompass these amendments and modifications.

The invention claimed is:

1. A digital to analog converter circuit, comprising a voltage dividing unit, a first segmenting unit, a second segmenting unit and a third segmenting unit, wherein,
the voltage dividing unit has $2^i+1$ voltage dividing signal terminals, which are defined as 1st to $2^i+1$th voltage dividing signal terminals according to voltage from low to high successively, wherein, i is an even number greater than or equal to 8;
first terminals of the first segmenting unit are connected in correspondence with the first to the $2^i+1$th voltage dividing signal terminals respectively, a second terminal of the first segmenting unit is connected with a first digital signal terminal, output terminals of the first segmenting unit are connected with a first node, a second node, a third node, a fourth node and a fifth node respectively, and the first segmenting unit is configured to, under control of a kth digital signal in a set of i−2 bit binary sequences received at the second terminal, provide a signal of a 4 k−3th voltage dividing signal terminal to the first node, provide a signal of a 4 k−2th voltage dividing signal terminal to the second node, provide a signal of a 4 k−1th voltage dividing signal terminal to the third node, provide a signal of a 4 kth voltage dividing signal terminal to the fourth node, and provide a signal of a 4 k+1th voltage dividing signal terminal to the fifth node, wherein k is an integer greater than or equal to 1 and less than or equal to $2^{i-2}$;

a first terminal of the second segmenting unit is connected with the first node, a second terminal of the second segmenting unit is connected with the second node, a third terminal of the second segmenting unit is connected with the third node, a fourth terminal of the second segmenting unit is connected with the fourth node, a fifth terminal of the second segmenting unit is connected with the fifth node, a sixth terminal of the second segmenting unit is connected with a second digital signal terminal, output terminals of the second segmenting unit are connected with a sixth node and a seventh node respectively, and the second segmenting unit is configured to, under control of an mth digital signal in a set of 2 bit binary sequences received at the sixth terminal of the second segmenting unit, provide a signal of an mth terminal of the second segmenting unit to the sixth node, and provide a signal of an m+1th terminal of the second segmenting unit to the seventh node, wherein m is an integer greater than or equal to 1 and less than or equal to 4;

a first terminal of the third segmenting unit is connected with the sixth node, a second terminal of the third segmenting unit is connected with the seventh node, an output terminal of the third segmenting unit is connected with an analog signal output terminal of the digital to analog converter circuit, and the third segmenting unit is configured to provide four analog signals with different voltages corresponding to a voltage of the first terminal of the third segmenting unit to the analog signal output terminal.

2. The digital to analog converter circuit as claimed in claim 1, wherein the first segmenting unit comprises a first switch control sub-circuit, a second switch control sub-circuit, a third switch control sub-circuit, a fourth switch control sub-circuit and a fifth switch control sub-circuit, wherein,
first terminals of the first switch control sub-circuit are connected in correspondence with the 4 k−3th voltage dividing signal terminal respectively, a second terminal of the first switch control sub-circuit is connected with the first digital signal terminal, an output terminal of the first switch control sub-circuit is connected with the first node, and the first switch control sub-circuit is configured to, under control of a kth digital signal received at the second terminal of the first switch control sub-circuit, provide a signal of the 4 k−3th voltage dividing signal terminal to the first node;
first terminals of the second switch control sub-circuit are connected in correspondence with the 4 k−2th voltage dividing signal terminal respectively, a second terminal of the second switch control sub-circuit is connected with the first digital signal terminal, an output terminal of the second switch control sub-circuit is connected with the second node, and the second switch control sub-circuit is configured to, under control of a kth digital signal received at the second terminal of the second switch control sub-circuit, provide the signal of the 4 k−2th voltage dividing signal terminal to the second node;
first terminals of the third switch control sub-circuit are connected in correspondence with the 4 k−1th voltage dividing signal terminal respectively, a second terminal of the third switch control sub-circuit is connected with the first digital signal terminal, an output terminal of the third switch control sub-circuit is connected with the third node, and the third switch control sub-circuit is configured to, under control of a kth digital signal received at the second terminal of the third switch control sub-circuit, provide the signal of the 4 k–1th voltage dividing signal terminal to the third node;

first terminals of the fourth switch control sub-circuit are connected in correspondence with the 4 kth voltage dividing signal terminal respectively, a second terminal of the fourth switch control sub-circuit is connected with the first digital signal terminal, an output terminal of the fourth switch control sub-circuit is connected with the fourth node, and the fourth switch control sub-circuit is configured to, under control of a kth digital signal received at the second terminal of the fourth switch control sub-circuit, provide the signal of the 4 kth voltage dividing signal terminal to the fourth node;

first terminals of the fifth switch control sub-circuit are connected in correspondence with the 4 k+1th voltage dividing signal terminal respectively, a second terminal of the fifth switch control sub-circuit is connected with the first digital signal terminal, an output terminal of the fifth switch control sub-circuit is connected with the fifth node, and the fifth switch control sub-circuit is configured to, under control of a kth digital signal received at the second terminal of the fifth switch control sub-circuit, provide the signal of the 4 k+1th voltage dividing signal terminal to the fifth node.

3. The digital to analog converter circuit as claimed in claim 2, wherein the first switch control sub-circuit comprises a first switch network of an i–2 bit binary switch tree type, wherein, first input terminals of the first switch network are connected in correspondence with the 4 k–3th voltage dividing signal terminal, a second input terminal of the first switch network is connected with the first digital signal terminal, and an output terminal of the first switch network is connected with the first node.

4. The digital to analog converter circuit as claimed in claim 2, wherein the second switch control sub-circuit comprises a second switch network of an i–2 bit binary switch tree type, wherein, first input terminals of the second switch network are connected in correspondence with the 4 k–2th voltage dividing signal terminal, a second input terminal of the second switch network is connected with the first digital signal terminal, and an output terminal of the second switch network is connected with the second node.

5. The digital to analog converter circuit as claimed in claim 2, wherein the third switch control sub-circuit comprises a third switch network of an i–2 bit binary switch tree type, wherein, first input terminals of the third switch network are connected in correspondence with the 4 k–1th voltage dividing signal terminal, a second input terminal of the third switch network is connected with the first digital signal terminal, and an output terminal of the third switch network is connected with the third node.

6. The digital to analog converter circuit as claimed in claim 2, wherein the fourth switch control sub-circuit comprises a fourth switch network of an i–2 bit binary switch tree type, wherein, first input terminals of the fourth switch network are connected in correspondence with the 4 k voltage dividing signal terminal, a second input terminal of the fourth switch network is connected with the first digital signal terminal, and an output terminal of the fourth switch network is connected with the fourth node.

7. The digital to analog converter circuit as claimed in claim 2, wherein the fifth switch control sub-circuit comprises a fifth switch network of an i–2 bit binary switch tree type, wherein, first input terminals of the fifth switch network are connected in correspondence with the 4 k+1th voltage dividing signal terminal, a second input terminal of the fifth switch network is connected with the first digital signal terminal, and an output terminal of the fifth switch network is connected with the fifth node.

8. The digital to analog converter circuit as claimed in claim 1, wherein the second segmenting unit comprises a sixth switch control sub-circuit and a seventh switch control sub-circuit, wherein, a first terminal of the sixth switch control sub-circuit is connected with the first node, a second terminal of the sixth switch control sub-circuit is connected with the second node, a third terminal of the sixth switch control sub-circuit is connected with the third node, a fourth terminal of the sixth switch control sub-circuit is connected with the fourth node, a fifth terminal of the sixth switch control sub-circuit is connected with the second digital signal terminal, an output terminal of the sixth switch control sub-circuit is connected with the sixth node, and the six switch control sub-circuit is configured to, under control of an mth digital signal received at the fifth terminal of the sixth switch control sub-circuit, provide a signal of the mth terminal of the sixth switch control sub-circuit to the sixth node;

a first terminal of the seventh switch control sub-circuit is connected with the second node, a second terminal of the seventh switch control sub-circuit is connected with the third node, a third terminal of the seventh switch control sub-circuit is connected with the fourth node, a fourth terminal of the seventh switch control sub-circuit is connected with the fifth node, a fifth terminal of the seventh switch control sub-circuit is connected with the second digital signal terminal, an output terminal of the seventh switch control sub-circuit is connected with the seventh node, and the seventh switch control sub-circuit is configured to, under control of an mth digital signal received at the fifth terminal of the seventh switch control sub-circuit, provide a signal of the mth terminal of the seventh switch control sub-circuit to the seventh node.

9. The digital to analog converter circuit as claimed in claim 8, wherein the sixth switch control sub-circuit comprises a sixth switch network of a 2 bit binary switch tree type, wherein, first input terminals of the sixth switch network are connected in correspondence with the first node, the second node, the third node and the fourth node, a second input terminal of the sixth switch network is connected with the second digital signal terminal, and an output terminal of the sixth switch network is connected with the sixth node.

10. The digital to analog converter circuit as claimed in claim 8, wherein the seventh switch control sub-circuit comprises a seventh switch network of a 2 bit binary switch tree type, wherein, first input terminals of the seventh switch network are connected in correspondence with the second node, the third node, the fourth node and the fifth node, a second input terminal of the seventh switch network is connected with the second digital signal terminal, and an output terminal of the seventh switch network is connected with the seventh node.

11. The digital to analog converter circuit as claimed in claim 1, wherein the third segmenting unit comprises an eighth switch control sub-circuit, a ninth switch control sub-circuit and an amplifier, wherein, a first terminal and a third terminal of the eighth switch control sub-circuit are connected with the sixth node respectively, a second terminal and a fourth terminal of the eighth switch control sub-circuit are connected with the seventh node respectively, a fifth terminal of the eighth switch control sub-circuit is connected with a third digital signal terminal, an output terminal of the eighth switch control sub-circuit is connected with a first non-inverting input terminal of the amplifier, and the eighth switch control sub-circuit is configured to, under control of an nth digital signal in a set of 2 bit binary sequences received at the fifth terminal of the eighth switch control sub-circuit, provide a signal of an nth terminal of the eighth switch control sub-circuit to the first non-inverting input terminal, wherein n is an integer greater than or equal to 1 and less than or equal to 4;

a first terminal and a second terminal of the ninth switch control sub-circuit are connected with the sixth node respectively, a third terminal and a fourth terminal of the ninth switch control sub-circuit are connected with the seventh node respectively, a fifth terminal of the ninth switch control sub-circuit is connected with the third digital signal terminal, an output terminal of the ninth switch control sub-circuit is connected with a second non-inverting input terminal of the amplifier, and the ninth switch control sub-circuit is configured to, under control of an nth digital signal in a set of 2 bit binary sequences received at the fifth terminal of the ninth switch control sub-circuit, provide a signal of an nth terminal of the ninth switch control sub-circuit to the second non-inverting input terminal;

a third non-inverting input terminal of the amplifier is connected with the sixth node, an inverting input terminal of the amplifier is connected with an output terminal of the amplifier and the analog signal output terminal respectively, and the amplifier is configured to add a voltage of a signal of the first non-inverting input terminal, a voltage of a signal of the second non-inverting input terminal and a voltage of a signal of the third non-inverting input terminal according to a preset sum rule, so as to output four analog signals with different voltages corresponding to the signal of the third non-inverting input terminal.

12. The digital to analog converter circuit as claimed in claim 11, wherein the eighth switch control sub-circuit comprises an eighth switch network of a 2 bit binary switch tree type, wherein, a first input terminal and a third input terminal of the eighth switch network are connected in correspondence with the sixth node respectively, a second input terminal and a fourth input terminal of the eighth switch network are connected in correspondence with the seventh node respectively, a fifth input terminal of the eighth switch network is connected with the third digital signal terminal, and an output terminal of the eighth switch network is connected with the first non-inverting input terminal.

13. The digital to analog converter circuit as claimed in claim 11, wherein the ninth switch control sub-circuit comprises a ninth switch network of a 2 bit binary switch tree type, wherein, a first input terminal and a second input terminal of the ninth switch network are connected in correspondence with the sixth node respectively, a third input terminal and a fourth input terminal of the ninth switch network are connected in correspondence with the seventh node respectively, a fifth input terminal of the ninth switch network is connected with the third digital signal terminal, and an output terminal of the ninth switch network is connected with the second non-inverting input terminal.

14. The digital to analog converter circuit as claimed in claim 11, wherein the amplifier is a rail to rail amplifier with three inputs.

15. The digital to analog converter circuit as claim in claim 14, wherein a width to length ratio of a channel of a thin film transistor of the first non-inverting input terminal: a width to length ratio of a channel of a thin film transistor of the second non-inverting input terminal: a width to length ratio of a channel of a thin film transistor of the third non-inverting input terminal is 1:2:1.

16. The digital to analog converter circuit as claimed in claim 15, the preset sum rule is ¼Ve1+½Ve2+¼Ve3, wherein Ve1 is a voltage of the first non-inverting input terminal, Ve2 is a voltage of the second non-inverting input terminal, and Ve3 is a voltage of the third non-inverting input terminal.

17. The digital to analog converter circuit as claimed in claim 1, wherein the voltage dividing unit comprises a resistor string with $2^i$ resistors connected in series, a reference voltage terminal and a ground terminal, wherein, the resistor string comprises $2^i+1$ series nodes, which are defined as 1st to $2^i+1$th series nodes according to voltage from low to high successively; the 1st series node is connected with the ground terminal, the $2^i+1$th series node is connected with the reference voltage terminal; the 1st to the $2^i+1$th series nodes are connected in correspondence with the 1st to the $2^i+1$th voltage dividing signal terminals.

18. The digital to analog converter circuit as claimed in claim 3, wherein a switch in the switch network is a CMOS transmission gate structure.

19. A display panel, comprising the digital to analog converter circuit as claimed in claim 1.

20. A display device, comprising the display panel as claimed in claim 19.

* * * * *